(12) United States Patent
Okamoto et al.

(10) Patent No.: US 9,406,897 B2
(45) Date of Patent: Aug. 2, 2016

(54) ORGANIC ELECTROLUMINESCENT ELEMENT AND ELECTRONIC DEVICE

(71) Applicant: Konica Minolta, Inc., Tokyo (JP)

(72) Inventors: Ken Okamoto, Hachioji (JP); Rieko Takahashi, Hino (JP); Kenji Arai, Kunitachi (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/668,439

(22) Filed: Mar. 25, 2015

(65) Prior Publication Data

US 2015/0287949 A1 Oct. 8, 2015

(30) Foreign Application Priority Data

Apr. 7, 2014 (JP) .................................. 2014-078614

(51) Int. Cl.
*H01L 29/08* (2006.01)
*H01L 51/50* (2006.01)

(52) U.S. Cl.
CPC ........ *H01L 51/5004* (2013.01); *H01L 51/5044* (2013.01); *H01L 51/5056* (2013.01)

(58) Field of Classification Search
CPC .................. H01L 51/5004; H01L 51/5044
USPC ........................................................ 257/40
See application file for complete search history.

(56) References Cited

U.S. PATENT DOCUMENTS

| 8,476,624 | B1* | 7/2013 | Wu ...................... H01L 51/5004 257/40 |
| 2012/0077987 | A1* | 3/2012 | Osaka .................. C07D 209/86 548/445 |
| 2012/0097998 | A1* | 4/2012 | Pieh ...................... H01L 51/504 257/89 |
| 2014/0084273 | A1* | 3/2014 | Nakayama .......... H01L 51/0071 257/40 |

FOREIGN PATENT DOCUMENTS

| JP | 2003151769 A | 5/2003 |
| JP | 2007173584 A | 7/2007 |
| JP | 2008218320 A | 9/2008 |

* cited by examiner

*Primary Examiner* — Matthew Gordon
(74) *Attorney, Agent, or Firm* — Lucas & Mercanti, LLP

(57) ABSTRACT

An organic electroluminescent element includes a layer having a shallower LUMO and a higher T1 than those of the first light-emitting layer on the anode side of the first light-emitting layer, and a layer which satisfies at least one of a deeper LUMO and includes a lower T1 than those of the second light-emitting layer on the anode side of the second light-emitting layer, and provides the organic electroluminescent element capable of suppressing the lowering of display quality.

9 Claims, 5 Drawing Sheets

ORGANIC ELECTROLUMINESCENT ELEMENT AND ELECTRONIC DEVICE

CROSS REFERENCE TO RELATED APPLICATION

This Application claims the priority of Japanese Patent Application No. 2014-078614 filed on Apr. 7, 2014, the contents of which is incorporated herein by reference.

BACKGROUND OF THE INVENTION

The present invention relates to an organic electroluminescent element, and an electronic device provided with the organic electroluminescent element.

1. Field of the Invention:

An organic electroluminescent element (hereinafter, also referred to as organic EL element) has a configuration in which a light-emitting layer containing a light-emitting compound is sandwiched by an anode and a cathode. In addition, the organic EL element is a light-emitting element which utilizes a phenomenon of recombining, by applying an electric field, a positive hole injected from an anode and an electron injected from a cathode in a light-emitting layer to thereby produce an exciton, and a phenomenon of light emission (fluorescence, phosphorescence) in deactivating the exciton. The organic EL element is a whole solid element constituted of a film of an organic material having a thickness of just a sub-micron meter between the electrodes, and the light emission can be promoted by applying several volts to several tens of volts. Therefore, the application to the next generation flat displays or lighting devices is expected.

For example, as the organic EL element, there has been proposed to construct a white light-emitting element by laminating light-emitting layers which emit different lights such as red, green and blue (for example, refer to Patent Document 1, Patent Document 2, Patent Document 3)

However, the organic EL element has, principally a different light-emitting wavelength for each light-emitting color, and a different light-emitting energy for each light-emitting color. Therefore, there is a difference in decomposition of the organic material generated simultaneously with the light emission, and in deterioration rate of the element caused by the decomposition of the organic material.

Accordingly, in the organic EL element having the configuration of combining different light-emitting colors, there has occurred principally color shift with the lapse of time. Particularly, the life time of blue light having a high energy is apt to be shorter than red light and green light.

2. Description of the Related Art:

[Patent Document 1] JP 2008-218320 A
[Patent Document 2] JP 2007-173584 A
[Patent Document 3] JP 2003-151769 A The organic EL element having the configuration of combining different light-emitting colors has, principally a different light-emitting wavelength for each light-emitting color, and a different light-emitting energy depending on each light-emitting color. Therefore, there is a difference in decomposition of the organic material generated simultaneously with the light emission, and in deterioration rate of the element caused by the decomposition of the organic material.

Accordingly, in the organic EL element having the configuration of combining different light-emitting colors, there has occurred principally color shift with the lapse of time. In addition, the color tone of the emitting lights of the organic electroluminescent element changes from the initial color tone with the lapse of time. As a result, the display quality of the organic electroluminescent element is lowered with the lapse of time.

In order to solve the above-described problem, the present invention is to provide an organic electroluminescent element capable of suppressing the lowering of the display quality, and an electronic device.

SUMMARY OF THE INVENTION

The organic electroluminescent element of the present invention is provided with an anode, a cathode, a first light-emitting layer and a second light-emitting layer which are interposed between the anode and the cathode. In addition, in the first light-emitting layer and a layer which is in contact with the first light-emitting layer on the anode side, the layer which is in contact with the first light-emitting layer satisfies the relations of having a shallower LUMO (Lowest Unoccupied Molecular Orbital) and of having a higher minimum triplet excitation energy (T1) than those of the first light-emitting layer. Furthermore, in the second light-emitting layer and a layer which is in contact with the second light-emitting layer on the anode side, the layer which is in contact with the second light-emitting layer satisfies at least one of the relations of having a deeper LUMO (Lowest Unoccupied Molecular Orbital) and of having a lower minimum triplet excitation energy (T1) than those of the second light-emitting layer.

In addition, the electronic device of the present invention is provided with the above-described organic electroluminescent element.

According to the organic electroluminescent element of the present invention, a layer which has a shallower LUMO and a higher T1 than those of one light-emitting layer is formed in contact with the light-emitting layer on one anode side. In addition, a layer which satisfies at least one condition of having a deeper LUMO and of having a lower T1 than those of the other light-emitting layer is formed in contact with the light-emitting layer on another anode side.

According to the configuration, the lowering of brightness of the light-emitting layer which is in contact with the layer having a shallower LUMO and a higher T1 can be suppressed, and the lowering of brightness of the light-emitting layer which is in contact with the layer which satisfies at least one of having a deeper LUMO and of having a lower T1 can be promoted.

As a result, the difference of the lowering of brightness of each light-emitting layer generated with the lapse of drive time can be regulated, and the change of color tone of the organic electroluminescent element can be suppressed. Therefore, the lowering of the display quality of the organic electroluminescent element and the electronic device provided with the organic electroluminescent element can be suppressed.

Effect of the Invention

According to the present invention, an organic electroluminescent element capable of suppressing the lowering of the display quality, and an electronic device can be provided.

DESCRIPTION OF THE PREFERRED EMBODIMENTS

Hereinafter, examples of embodiments to achieve the present invention will be explained, and the present invention is not limited to the following examples.

Note that explanation is done according to the following order.
1. Embodiment (first embodiment) of the organic electroluminescent element
2. Embodiment (second embodiment) of the organic electroluminescent element
3. Embodiment (third embodiment) of the organic electroluminescent element
4. Embodiment (fourth embodiment) of the organic electroluminescent element
5. Embodiment (fifth embodiment) of the electronic device <1. Embodiment (First Embodiment) of the Organic Electroluminescent Element>

Figure 1:
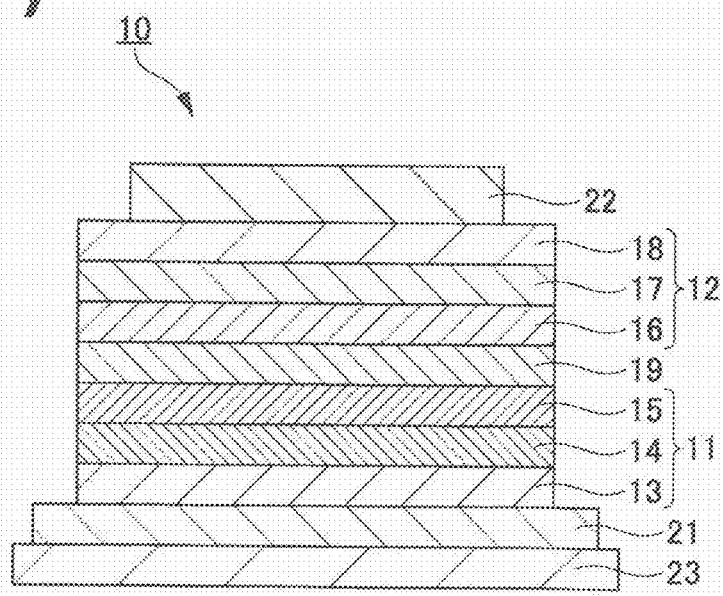
FIG. 1 shows the configuration of the organic EL element of a first embodiment.

Hereinafter, the specific embodiment of the organic electroluminescent element (organic EL element) of the present invention will be explained. FIG. 1 shows the configuration of the organic EL element of the first embodiment.

[Configuration of Organic EL Element]

The organic EL element 10 shown in FIG. 1 has an anode 21, a first light-emitting unit 11, am intermediate connector layer 19, a second light-emitting unit 12, and a cathode 22. In addition, these layers are all provided on a substrate 23.

In the organic EL element 10, the anode 21 is formed on the substrate 23, and the first light-emitting unit 11 is formed on the anode 21. Furthermore, an intermediate connector layer 19 is formed on the first light-emitting unit 11, and a second light-emitting unit 12 is formed on the intermediate connector layer 19. Moreover, a cathode 22 is formed on the second light-emitting unit 12.

The above-described organic EL element 10 has a configuration in which the anode 21 is constituted of a transparent electrode, and the cathode 22 functions as a reflecting electrode, and is a bottom emission type structure in which light is extracted from the substrate 23 side. Furthermore, the element is a so-called tandem type structure in which the first light-emitting unit 11 and the second light-emitting unit 12 are laminated via the intermediate connector layer 19.

The first light-emitting unit 11 has a configuration in which a first positive hole transport layer 13, a first light-emitting layer 14, and a first electron transport layer 15 are laminated and formed in order from the anode 21 side.

The second light-emitting unit 12 has a configuration in which a second positive hole transport layer 16, a second light-emitting layer 17, and a second electron transport layer 18 are laminated and formed in order from the anode 21 side (the intermediate connector layer 19 side).

The first positive hole transport layer 13 and the second positive hole transport layer 16 have a function of transporting a positive hole, and include, in a broad sense, a positive hole injection layer and an electron blocking layer, and the like. In addition, the first electron transport layer 15 and the second electron transport layer 18 have a function of transporting an electron, and include, in a broad sense, an electron injection layer and a positive hole blocking layer, and the like.

Furthermore, the organic EL element 10 is a white light-emitting element which contains at least a light-emitting organic material, for example, has light-emitting dopants of blue (B), green (G) and red (R) colors as the light-emitting organic material, in the first light-emitting layer 14 and the second light-emitting layer 17.

In order to enhance the light-emitting efficiency of the organic EL element 10, it is preferable to provide a light-emitting layer which emits light having a short wavelength on the light extraction side. Therefore, in the organic EL element 10 shown in FIG. 1, there is preferably contained a light-emitting dopant which emits blue light having a short wavelength in the first light-emitting layer 14. In addition, there is preferably contained light-emitting dopants of green (G) and red (R) in the second light-emitting layer 17.

Accordingly, in the organic EL element 10 shown in FIG. 1, the first light-emitting layer 14 is a blue light-emitting layer containing a blue light-emitting dopant, and the second light-emitting layer 17 is a green and red (yellow) light-emitting layer containing a green light-emitting dopant and a red light-emitting dopant.

[Summary of the Embodiment]

Generally, in an organic EL element, the light emission having a shorter wavelength has larger light emission energy. In addition, because of large light emission energy, the light-emitting layer emitting light (blue) having a short wavelength easily generates the deterioration of the compound itself constituting the light-emitting layer in comparison with the other light-emitting layers. Therefore, the light-emitting layer emitting light (blue) having a short wavelength easily lowers its brightness with the lapse of drive time in comparison with the light-emitting layer emitting light having a longer wavelength.

Furthermore, the lowering rate of brightness with the lapse of drive time is different depending on a kind of material constituting the light-emitting layer, regardless the wavelength.

In this way, the light-emitting layer which easily generates the lowering of the brightness with the lapse of drive time is assumed to be a light-emitting layer with generally large reduction in brightness. Moreover, the light-emitting layer which easily generates the lowering of the brightness with the lapse of drive time is assumed to be a light-emitting layer with generally small reduction in brightness.

Note that the light-emitting layer with generally large reduction in brightness and the light-emitting layer with generally small reduction in brightness exhibit a magnitude of the reduction in brightness of each light-emitting layer, in the case of changing only a light-emitting layer in the organic EL element having the same configuration and emitting light continuously under the same condition.

When a brightness of the light-emitting layer with generally large reduction in brightness, for example a light-emitting layer having a short wavelength is lowered, the light extracted from the organic EL element is changed with the lapse of drive time. For example, the extracted light is changed from initial white light to strong yellowish light derived from the light-emitting layer of green and red lights to lower the quality of the organic EL element as the white light.

In order to avoid the lowering of the quality with the lapse of drive time of the organic EL element, it is necessary to regulate the balance of reduction in brightness between the light emitting layer with generally large reduction in brightness and the light emitting layer with generally small reduction in brightness so as to lower a deviation from the balance of the initial white light. For example, it is necessary to regulate the balance of reduction in brightness of each color (reddish green and blue). In order to do this, it is necessary to suppress the reduction in brightness of the light emitting layer with generally large reduction in brightness of the short wavelength (blue), or to lower the brightness of the light emitting layer with generally small reduction in brightness of the long wavelength (green, red) to the shorter wavelength side.

In the organic EL element 10 according to the present embodiment, by regulating the LUMO (Lowest Unoccupied Molecular Orbital) and the minimum triplet excitation energy (T1) of the layers being in contact with the first light-emitting layer 14 and the second light-emitting layer 17, it is possible to balance the reduction in brightness with the lapse of drive time of each light-emitting layer.

Specifically, as to the light-emitting layer with generally large reduction in brightness, for example the first light-emitting layer 14 which emits light having a short wavelength, a layer having a shallower LUMO (Lowest Unoccupied Molecular Orbital) and a higher minimum triplet excitation energy (T1) than the first light-emitting layer 14 is provided as a layer which is in contact with the first light-emitting layer 14 on the anode 21 side.

In addition, as to the light-emitting layer with generally small reduction in brightness, for example the second light-emitting layer 17 which emits light having a long wavelength, a layer satisfying at least one of a deeper LUMO (Lowest Unoccupied Molecular Orbital) and a lower minimum triplet excitation energy (T1) than the second light-emitting layer 17 is provided as a layer which is in contact with the second light-emitting layer 17 on the anode 21 side.

When the layer having a shallower LUMO and a higher T1 is in contact with the first light-emitting layer 14 on the anode 21 side, the deterioration of the first light-emitting layer 14 can be suppressed.

Furthermore, when the layer having a deeper LUMO or a lower T1 than those of the second light-emitting layer 17 is in contact with the second light-emitting layer 17 on the anode 21 side, the deterioration with the lapse of drive time of the second light-emitting layer 17 can be promoted.

In this way, the balance of the brightness between the first light-emitting layer 14 and the second light-emitting layer 17 can be regulated by suppressing the deterioration of the first light-emitting layer 14 and promoting the deterioration of the second light-emitting layer 17, and thus the lowering of the quality of white light emission of the organic EL element 10 can be suppressed.

[Regulation of Brightness]

Figure 2:
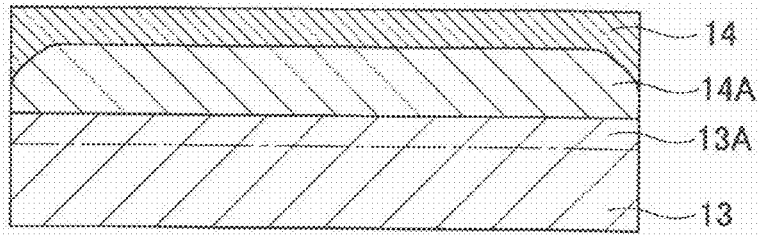
FIG. 2 shows a vicinity of an interface between the first light-emitting layer and the first positive hole transport layer of the organic EL element of the first embodiment.
Figure 3:
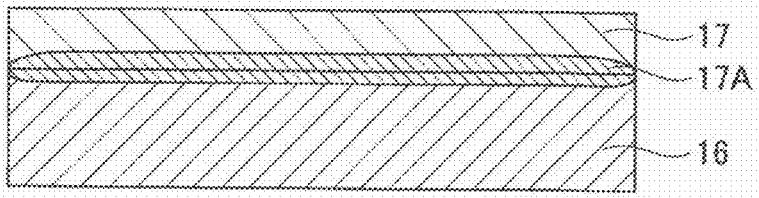
FIG. 3 shows a vicinity of an interface between the second light-emitting layer and the second positive hole transport layer of the organic EL element of the first embodiment.

Next, the mechanism that regulates the brightness of the first light-emitting layer 14 and the second light-emitting layer 17 will be explained. FIG. 2 shows a vicinity of an interface between the first light-emitting layer 14 and the first positive hole transport layer 13. FIG. 3 shows a vicinity of an interface between the second light-emitting layer 17 and the second positive hole transport layer 16. FIG. 2 and FIG. 3 show the states of light emission when applying an electric field to the first light-emitting layer 14 and the second light-emitting layer 17.

The first positive hole transport layer 13 is formed as a layer having a shallower LUMO and a higher T1 than those of the first light-emitting layer 14. Therefore, as shown in FIG. 2, the surface region of the interface of the first positive hole transport layer 13 and the first light-emitting layer 14 functions as an electron blocking layer 13A. Accordingly, the electron injected to the first light-emitting layer 14 is prevented from being transported to the first positive hole transport layer 13, and becomes easily stored in the first light-emitting layer 14. In addition, as shown in FIG. 2, a light-emitting region 14A in the first light-emitting layer 14 is enlarged from the interface of the first positive hole transport layer 13 to the deep portion of the first light-emitting layer 14.

In contrast, the second positive hole transport layer 16 is formed as a layer having a deeper LUMO or a lower T1, or a layer having a deeper LUMO and a lower T1 than those of the second light-emitting layer 17.

In this way, the electron injected to the second light-emitting layer 17 is easily transported to the second positive hole transport layer 16, and is less likely to be stored in the second light-emitting layer 17 by forming the layer which satisfies at least one of the conditions of a deeper LUMO and a lower T1 than those of the second light-emitting layer 17 as the second positive hole transport layer 16.

As a result, as shown in FIG. 3, a light-emitting region 17A in the second light-emitting layer 17 is generated, in a concentrated manner, within a narrow region in the vicinity of the interface between the second light-emitting layer 17 and the second positive hole transport layer 16 in a concentrated manner. In addition, the light-emitting region 17A is generated in a region extending over the second light-emitting layer 17 to the second positive hole transport layer 16.

As described above, it is possible to regulate the light-emitting region in the light-emitting layer by regulating the LUMO and T1 of the layer formed on the anode side of the light-emitting layer. In general, when the light-emitting region in the light-emitting layer becomes wide, the concentration of the light-emitting energy is alleviated and the deterioration of the compound can be suppressed. In contrast to this, when the light-emitting region is narrowed, the light-emitting energy is easily concentrated, and thus the compound becomes easily deteriorated in this concentrated region.

Accordingly, in the organic EL element 10, by providing the first positive hole transport layer 13 having a shallower LUMO and a higher T1 than those of the first light-emitting layer 14 in contact with the first light-emitting layer 14 on the anode side 21, the light-emitting region 14A is enlarged and thus the concentration of the light-emitting energy is alleviated. Therefore, the deterioration of the compound constituting the first light-emitting layer 14 is suppressed. As a result, the reduction in the brightness of the first light-emitting layer 14 with the lapse of drive time can be suppressed.

Furthermore, in the organic EL element 10, the light-emitting region 17A is concentrated within a narrow region, and the light-emitting energy is concentrated into the narrow light-emitting region 17A, by providing the second positive hole transport layer 16 having at least one of a deeper LUMO and a lower T1 than those of the second light-emitting layer 17 in contact with the second light-emitting layer 17 on the anode 21 side. As a result, the compound constituting the second light-emitting layer 17 is easily deteriorated, and the reduction in the brightness of the second light-emitting layer 17 with the lapse of drive time can be made large.

Accordingly, it is possible to suppress the reduction in brightness of the light having a short wavelength, by containing a compound which emits light having a short wavelength and having a generally large reduction in brightness in the first light-emitting layer 14. In addition, it is possible to promote the reduction in brightness of the light having a long wavelength, by containing a compound which emits light having a long wavelength and having a generally small reduction in brightness in the second light-emitting layer 17.

Furthermore, in the organic EL element 10, by the fact that the first light-emitting layer 14 and the first positive hole transport layer 13 and the second light-emitting layer 17 and the second positive hole transport layer 16 are constituted as described above, the reduction in brightness of the light having a short wavelength and the reduction in brightness of the light having a long wavelength can be regulated in a well balanced manner. As a result, the color change of the white light with the lapse of drive time can be suppressed, and thus the lowering of the quality of the white light which is extracted from the organic EL element 10 can be suppressed.

(Configuration of Positive Hole Transport Layer)

The above-described first positive hole transport layer 13 having a shallower LUMO and a higher T1 than those of the first light-emitting layer 14 is preferably constituted of a material having a function of the positive hole transport layer and a low capability of transporting an electron while keeping the function of transporting a positive hole. For example, from the materials to be applied to the positive hole transport layer described below, the first positive hole transport layer 13 can be formed by selecting a material having a shallower LUMO and a higher T1 than those of the first light-emitting layer 14. Particularly, it is preferable to form the first positive hole transport layer 13 by applying the configuration of the electron blocking layer described below.

Furthermore, the first positive hole transport layer 13 may be a laminated structure of the two or more layers constituted of a material having a function of the positive hole transport layer and a low capability of transporting an electron while keeping the function of transporting a positive hole. In this case, the layer being in contact with the first light-emitting layer 14 is made as a layer having a shallower LUMO and a higher T1 than those of the first light-emitting layer 14.

In addition, the above-described second positive hole transport layer 16 having at least one of a deeper LUMO and a lower T1 than those of the second light-emitting layer 17 is preferably constituted of a material having a low capability of transporting an electron while keeping the function of transporting a positive hole. Specifically, from the materials to be applied to the positive hole transport layer described below, the second positive hole transport layer 16 can be formed by selecting a material having at least one of a deeper LUMO and a lower T1 than those of the second light-emitting layer 17.

Moreover, the second positive hole transport layer 16 may be a laminated structure of the two or more layers constituted of a material having a function of the positive hole transport layer and a low capability of transporting an electron while keeping the function of transporting a positive hole. In this case, the layer being in contact with the second light-emitting layer 17 is made as a layer having at least one of a deeper LUMO and a lower T1 than those of the second light-emitting layer 17.

[Thickness of Light-emitting Layer]

A thickness of the second light-emitting layer 17 is preferably smaller than that of the first light-emitting layer 14. In the second light-emitting layer 17, the light-emitting region 17A is easily concentrated within a narrow region when the thickness is small. Therefore, the degradation of the compound can be further promoted.

In addition, in the first light-emitting layer 14, in order to enlarge the light-emitting region 14A, a thickness of a certain degree is required. Therefore, the first light-emitting layer 14 preferably has a thickness at least larger than that of the second light-emitting layer 17.

For example, the thickness of the first light-emitting layer 14 is preferably 10 to 100 nm. In addition, the second light-emitting layer 17 is formed thinner than the first light-emitting layer 14, and for example, the thickness of the second light-emitting layer 17 is preferably 5 to 50 nm.

Furthermore, the LUMO and T1 of the first light-emitting layer 14 and the second light-emitting layer 17 depend on the LUMO and T1 of a host compound, when a concentration of a dopant is 15% or less. When a concentration of the dopant is more than 15%, the LUMO and T1 of the first light-emitting layer 14 and the second light-emitting layer 17 are determined from the LUMO and T1 of the host compound in consideration of the LUMO and T1 of the dopant.

Moreover, when the first light-emitting layer 14 and the second light-emitting layer 17 contain a plurality of host compound and dopants, the LUMO and T1 of first light-emitting layer 14 and the second light-emitting layer 17 are determined depending on the compound in largest amount.

In addition, the LUMO and T1 of the first positive hole transport layer 13 and the second positive hole transport layer 16 is generally depend on the LUMO and T1 of the compound contained in largest amount. In addition, when the first positive hole transport layer 13 and the second positive hole transport layer 16 contain a plurality of compounds, the LUMO and T1 of the first positive hole transport layer 13 and the second positive hole transport layer 16 are determined by considering the proportion of each compound. A compound contained in an amount of 15% or less gives a slight influence, and the influence on the LUMO and T1 of the first positive hole transport layer 13 and the second positive hole transport layer 16 is scarcely required to be considered.

Furthermore, in the first light-emitting layer 14 and the first positive hole transport layer 13, and the second light-emitting layer 17 and the second positive hole transport layer 16, the LUMO and T1 may be considered only in each region on the side close to the adjacent interface. In the above-described each layer, deactivation is caused by electron transfer and energy transfer between compounds. In order to cause this electron transfer (Marcus Type) and energy transfer (Foerster mechanism, Dexter mechanism), a distance between compounds is required to be close. Therefore, in the interface between each above-described layer, it is necessary to consider the LUMO and T1 of the region on the side close to the interface.

[Details of Configuration]

Hereinafter, as to the organic EL element 10 shown in FIG. 1, there will be explained each of the configurations of the anode 21, the first light-emitting unit 11 (the first positive hole transport layer 13, the first light-emitting layer 14, the first electron transport layer 15), the intermediate connector layer 19, the second light-emitting unit 12 (the second positive hole transport layer 16, the second light-emitting layer 17, the second electron transport layer 18), and the cathode 22, and the configuration of the substrate 23 where the organic EL element 10 is provided. Note that each configuration of the organic EL element 10 explained in the following is one example of explaining embodiment, and it is also possible to optionally apply other configuration within a scope in which the above-described organic EL element 10 can be constituted.

[Light-emitting Unit]

The first light-emitting unit 11 is provided between the anode 21 and the intermediate connector layer 19, and includes at least one of a light-emitting layer containing an organic material having light-emitting property. The second light-emitting unit 12 is provided between the intermediate connector layer 19 and the cathode 22, and includes at least one of a light-emitting layer containing an organic material having light-emitting property. Note that, in the first light-emitting unit 11 and the second light-emitting unit 12, other layers may be provided among the light-emitting layer, the anode 21, the intermediate layer 19 and the cathode 22.

Hereinafter, the first light-emitting unit 11 and the second light-emitting unit 12 will be explained by being represented as the light-emitting unit in a comprehensive way. Furthermore, the first positive hole transport layer 13, the first light-emitting layer 14 and the first electron transport layer 15, and the second positive hole transport layer 16, the second light-emitting layer 17 and the second electron transport layer 18, which are formed in the first light-emitting unit 11 and the second light-emitting unit 12, are explained by being represented as the positive hole transport layer, the light-emitting layer and the electron transport layer in a comprehensive way.

The typical element configurations of the light-emitting unit are as follows, but not limited thereto.
(1) Positive injection transport layer/light-emitting layer/electron injection transport layer
(2) Positive injection transport layer/first light-emitting layer/second light-emitting layer/electron injection transport layer
(3) Positive injection transport layer/first light-emitting layer/intermediate connector layer/second light-emitting layer/electron injection transport layer
(4) Positive hole injection transport layer/light-emitting layer/positive hole blocking layer/electron injection transport layer
(5) Positive hole injection transport layer/electron blocking layer/light-emitting layer/positive hole blocking layer/electron injection transport layer
(6) Positive hole injection layer/positive hole transport layer/light-emitting layer/electron transport layer/electron injection layer
(7) Positive hole injection layer/positive hole transport layer/light-emitting layer/positive hole blocking layer/electron transport layer/electron injection layer
(8) Positive hole injection layer/positive hole transport layer/electron blocking layer/light-emitting layer/positive hole blocking layer/electron transport layer/electron injection layer In the above configurations, the light-emitting layer is constituted of a single layer or multiple layers.

The electron transport layer is a layer having a function of transporting an electron. The electron transport layer includes the electron injection layer and the positive hole blocking layer in a broad sense. In addition, the electron transport layer may be constituted of multiple layers.

The positive hole transport layer is a layer having a function of transporting a positive hole. The positive hole transport layer also includes the positive hole injection layer and the electron blocking layer in a broad sense. Furthermore, the positive hole transport layer may be constituted of multiple layers.

Although a phosphorescent light-emitting material and a fluorescent light-emitting material are mixed with each other in the light-emitting layer of the light-emitting unit, it is preferable to be constituted of only a phosphorescent light-emitting material or a fluorescent light-emitting material. The fluorescent light-emitting layer and the phosphorescent light-emitting layer are preferably a light-emitting layer of a host, dopant type. Moreover, the light-emitting dopant contained in the light-emitting layer may be contained at a uniform concentration or may have a concentration distribution, in the thickness direction of the light-emitting layer.

When providing a plurality of light-emitting units in the organic EL element, light-emitting units having different configurations can be used, but it is preferable that the light-emitting units have the same configuration except for the light-emitting layer. Furthermore, the respective light-emitting units preferably have the same number of light-emitting layers. As a result, since a number of materials to be used can be small, there are advantages in cost performance and in product performance such as quality control. Moreover, in case of vapor deposition process, there is an advantage in product efficiency such that a film-forming chamber can easily be made common among the light-emitting units.

In addition, in the case of trying to obtain the white light emission by laminating the light-emitting units exhibiting different light-emitting colors, the light-emitting units preferably have a relationship of complementary color each other. For example, an organic EL element exhibiting white light emission can be made by providing a blue light-emitting unit and a light-emitting unit that exhibits a light-emitting color of yellowish green, yellow or orange which is a complementary color to blue. Note that the relation of "complementary colors" means a relation in which, when mixing colors, an obtained color is achromatic color. Namely, when mixing materials which emit colors having the relation of complementary colors, a white light emission can be obtained.

For obtaining a white light emission of excellent quality and easily regulating chromaticity in a wide range, it is preferable that layers exhibiting light-emitting colors of green and red are provided in any one of light-emitting units, in addition to a blue light-emitting layer. Alternatively, one light-emitting unit may be provided as a light-emitting layer in which light-emitting materials of blue, green and red are mixed in one light-emitting layer to thereby exhibit a white light emission.

Figure 4:
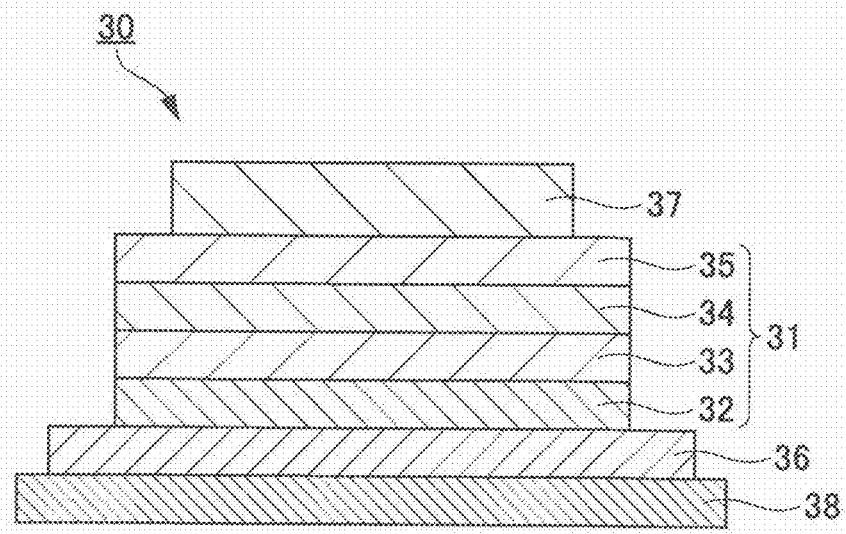
FIG. 4 shows the configuration of the organic EL element of a second embodiment.

The emitting color of an organic EL element and a compound is determined by applying the result of measurement by using a spectral emission luminance meter CS-2000 (manufactured by KONICA MINOLTA SENCING) to a CIE chromaticity coordinate in FIG. 4.16 of page 108 of "SHINHEN SIKISAI KAGAKU HANDBOOK" (edited by THE COLOR SCIENCE ASSOCIATION OF JAPAN, published from University of Tokyo Press, 1985).

A white light color is assumed to be referred to as a light color in which a deviation Duv of a light color from the blackbody radiation locus is included within the range of −20 to +20 in a relative color temperature range of 2500 to 7500 K. The Duv (=1000 duv) is defined in accordance with "Distributed temperature and color temperature of light source Relative Color Temperature Measuring Method" of JIS Z 8725: 1999.

A thickness of each layer included in each light-emitting unit is not particularly limited. From the viewpoint of homogeneousness of the film to be formed, prevention of application of unnecessary high voltage at the time of a light emission, and stability of light-emitting color to a drive current, it is preferable to regulate within the range of 5 to 200 nm, more preferable to regulate within the range of 10 to 100 nm.

A method of forming each layer included in each light-emitting unit is not particularly limited as long as a thin layer can be formed, and examples thereof include a vapor deposition method, a sputtering method, a wet process (a spin coating method, a casting method, an inkjet method, an LB method, a spraying method, a printing method, a slot-type coater method), and the like. Among them, a vacuum vapor deposition method, a spin coating method, an inkjet method, a printing method and a slot-type coater method are particularly preferable from the viewpoint that the lower layer is less damaged and a homogeneous film without any pinhole is easily obtained.

[Light-emitting Layer]

The light-emitting layer is a layer containing a light-emitting organic semiconductor thin film and providing a field where an electron and a positive hole which are injected from the electrode or the adjacent layer are recombined to thereby emit light through an exciton. The portion to be emitted may be in the layer of the light-emitting layer or may be at the interface between the light-emitting layer and the adjacent layer.

The light-emitting layer preferably contains the light-emitting dopant (light-emitting dopant compound, dopant compound, simply referred to as dopant) and a host compound (matrix material, light emitting host compound, simply referred to as host).

The layer constituting the light-emitting layer may be any number of layers, and may have a plurality of layers having the same light-emitting spectrum or maximum emission wavelength.

The total thickness of the light-emitting layers is not particularly limited, and it is preferable to regulate the total thickness within the range of 5 to 200 nm, more preferably to regulate the total thickness within the range of 10 to 150 nm from the viewpoints of homogeneity of the formed film, prevention of applying unnecessary high voltage at the time of the light emission, and stability improvement of light-emitting color to a drive current. Furthermore, the thickness of each light-emitting layer is preferably regulated within the range of 5 to 200 nm, more preferably regulated within the range of 10 to 40 nm.

The method for forming the light-emitting layer is not particularly limited, and the light-emitting layer can be formed by film-formation of the light-emitting dopant and the host compound described later through the use of, for example, a known film-forming method such as vacuum vapor deposition method, spin coating method, casting method, LB (Langmuir-Blodgett) method, inkjet method, spraying method, printing method or slot-type coater method.

(1. Light-emitting Dopant)

There are preferably used, as the light-emitting dopant, a fluorescent light-emitting dopant (also referred to as fluorescent dopant, fluorescent compound) and a phosphorescent light-emitting dopant (also referred to as phosphorescent dopant, phosphorescent compound). A concentration of the light-emitting dopant in the light-emitting layer can be optionally determined on the basis of the necessary requirements from the specific dopant and device, to be used. The concentration of the light dopant may be uniform or may have an optional distribution, in the thickness direction of the light-emitting layer.

Furthermore, the light-emitting layer may contain plural kinds of the light-emitting dopants. For example, dopants having different structures may be combined, or the fluorescent light-emitting dopant and the phosphorescent light-emitting dopant maybe combined. Thereby, an optional light-emitting color can be obtained.

The organic EL element preferably shows a white light emission by containing a plurality of light-emitting dopants having different light-emitting colors in one or more light-emitting layers. The combination of the light-emitting dopants exhibiting a white color is not particularly limited, and examples are the combination of blue and orange, the combination of blue, green and red, and the like. As to the white color in the organic EL element is preferably, it is preferable that a chromaticity of the CIE1931 color system at 1000 cd/m$^2$ is within the region of x=0.39±0.09, y=0.38±0.08 when measuring a 2 degrees viewing angle front luminance by the above-described method.

(1-1. Phosphorescent Light-emitting Dopant)

The phosphorescent light-emitting dopant is a compound in which a light emission from excited triplet is observed, and specifically is a compound which emits phosphorescent light at room temperature (25° C.) and a compound having a quantum yield of phosphorescent light at 25° C. of 0.01 or more. In the phosphorescent light-emitting dopant used for the light-emitting layer, a preferable quantum yield of phosphorescent light is 0.1 or more.

The above-described quantum yield of phosphorescent light can be measured by the method described in Fourth Edition JIKKEN KAGAKU KOZA 7, SPECTRUM II, page 398 (1992 edition, MARUZEN). The quantum yield of phosphorescent light in a solution can be measured by using various solvents. The phosphorescent light-emitting dopant used in the light-emitting layer may attain the above-described quantum yield of phosphorescent light (0.01 or more) in any of optional solvents.

The principal of the light emission of the phosphorescent light-emitting dopant are the following two principals.

One is an energy transfer type in which an excited state of the host compound is generated by recombining a carrier on the host compound in which the carrier is transported, and then the generated energy is transferred to the phosphorescent light-emitting dopant to thereby emit light from the phosphorescent light-emitting dopant. Another is a carrier trap type in which the phosphorescent light-emitting dopant serves as a carrier trap, and the carriers are recombined on the phosphorescent light-emitting dopant, and then light is emitted from the phosphorescent light-emitting dopant. In both cases, it is necessary that the energy of the excited state of the phosphorescent light-emitting dopant is lower than the energy of the excited state of the host compound.

The phosphorescent light-emitting dopant can be used by appropriate selection from a known material used for the light-emitting layer of the organic EL element.

Examples of the known phosphorescent light-emitting dopant include the compounds described in the following documents, and the like.

Examples of the phosphorescent light-emitting dopant preferably include the compounds represented by the general formula (4), the general formula (5), the general formula (6) described in the paragraphs [0185] to [0235] of JP 2013-4245 A, and the exemplified compounds (Pt-1 to Pt-3, Os-1, and Ir-1 to Ir-45). In addition, the other exemplified compounds are the following Ir-46, Ir-47, Ir-48 shown.

[Chem. 1]

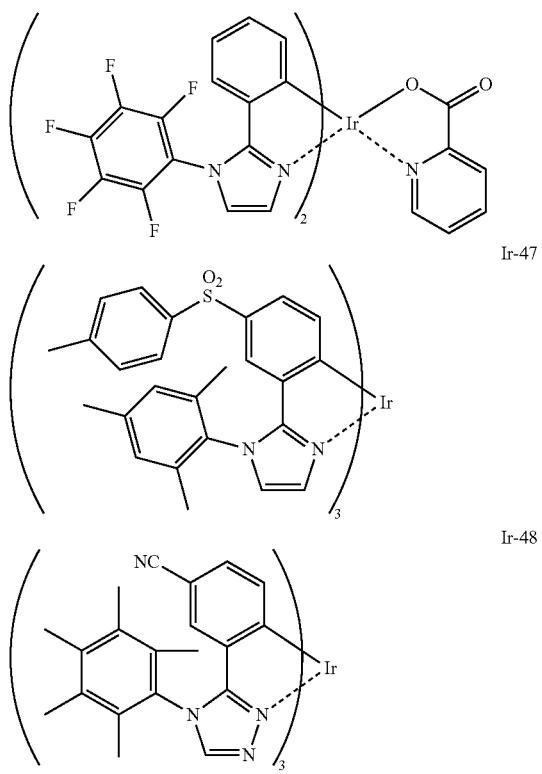

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991 A, WO 2008/101842 A, WO 2003/040257 A, US 2006/835469 A, US 2006/0202194 A, US 2007/0087321 A, US 2005/0244673 A.

Inorg. Chem. 40, 1704 (2001), Chem. Mater. 16, 2480 (2004), Adv. Mater. 16, 2003 (2004), Angew. Chem. lnt. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290 A, WO 2002/015645 A, WO 2009/000673 A, US 2002/0034656 A, U.S. Pat. No. 7,332,232 B, US 2009/0108737 A, US 2009/0039776 A, U.S. Pat. Nos. 6,921,915 B, 6,687,266 B, US 2007/0190359 A, US 2006/0008670 A, US 2009/0165846 A, US 2008/0015355 A, U.S. Pat. Nos. 7,250,226 B, 7,396,598 B, US 2006/0263635 A, US 2003/0138657 A, US 2003/0152802 A, U.S. Pat. No. 7,090,928 B.

Angew. Chem. lnt. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2002/002714 A, WO 2006/009024 A, WO 2006/056418 A, WO 2005/019373 A, WO 2005/123873 A, WO 2005/123873 A, WO 2007/004380 A, WO 2006/082742 A, US 2006/0251923 A, US 2005/0260441 A, U.S. Pat. Nos. 7,393,599 B, 7,534,505 B, 7,445,855 B, US 2007/0190359 A, US 2008/0297033 A, U.S. Pat. No. 7,338,722 B, US 2002/0134984 A, U.S. Pat. No. 7,279,704 B, US 2006/098120 A, US 2006/103874 A WO 2005/076380 A, WO 2010/032663 A, WO 2008/140115 A, WO 2007/052431 A, WO 2011/134013 A, WO 2011/157339 A, WO 2010/086089 A, WO 2009/113646 A, WO 2012/020327 A, WO 2011/051404 A, WO 2011/004639 A, WO 2011/073149 A, US 2012/228583 A, US 2012/212126 A, JP 2012-069737 A, JP 2012-195554 A, JP 2009-114086 A, JP 2003-81988 A, JP 2002-302671 A, JP 2002-363552 A Among them, the preferred phosphorescent light-emitting dopant is an organometal complex having Ir as a main metal. A complex containing at least one coordination mode of a metal-carbon bond, a metal-nitrogen bond, a metal-oxygen bond, and a metal-sulfur bond are more preferable.

(1-2. Fluorescent Light-emitting Dopant)

The fluorescent light-emitting dopant is a compound capable of emission from an excited singlet, and is not particularly limited as long as the emission from the excited singlet is observed.

Examples of the fluorescent light-emitting dopant include an anthracene derivative, a pyrene derivative, a chrysene derivative, a fluoranthene derivative, a perylene derivative, a fluorene derivative, an arylacetylene derivative, a styrylarylene derivative, a styrylamine derivative, an arylamine derivative, a boron complex, a coumarin derivative, a pyran derivative, a cyanine derivative, a croconium derivative, a squalium derivative, an oxobenzanthracene derivative, a fluorescein derivative, a rhodamine derivative, a pyrylium derivative, a perylene derivative, a polythiophene derivative, or a rare earth complex-based compound, and the like.

Furthermore, a light-emitting dopant utilizing delayed fluorescence may be used as the fluorescent light-emitting dopant. Examples of the light-emitting dopant utilizing delayed fluorescence include compounds described in WO 2011/156793 A, JP 2011-213643 A, JP 2010-93181 A, and the like.

(2. Host Compound)

The host compound is a compound mainly serving injection and transport of an electric charge in the light-emitting layer, and the light emission of the host compound itself cannot substantially be observed in the organic EL element.

The host compound is preferably a compound having a phosphorescence quantum yield of phosphorescence emission at room temperature (25° C.) of less than 0.1, more preferably a compound having a phosphorescence quantum yield of phosphorescence emission of less than 0.01. In addition, it is preferable that a mass ratio in the light-emitting layer, in the compounds contained in the layer, is 20% or more.

Furthermore, the excited state energy of the host compound is preferably higher than the excited state energy of the light-emitting dopant contained in the same layer.

The host compound may be used alone or in combination of two or more kinds. The transfer of the electric charge can be controlled by using plural kinds of the host compounds, and it becomes possible to increase the efficiency of the organic EL element.

The host compound used in the light-emitting layer is not particularly limited, and a compound used in the conventional organic EL element can be used. Examples are a low-molecular-weight compound, a polymeric compound having repeating units, or a compound having a reactive group such as a vinyl group or an epoxy group.

The known host compound preferably has a high glass transition temperature (Tg) from the viewpoints of prevention of the longer wavelength of the light emission while keeping the positive hole transport capability and the electron transport capability, and further the stability against heat generation at the time of high temperature driving or during element driving of the organic EL element. The Tg of the host compound is preferably 90° C. or more, more preferably 120° C. or more.

Here, the glass transition temperature (Tg) is a value obtained by the method in accordance with JIS-K-7121 by using a DSC (Differential Scanning Colorimetry).

Furthermore, the host compound of the light-emitting layer containing the phosphorescent light-emitting dopant preferably has a minimum excited triplet energy (T1) of more than 2.1 eV. When T1 is more than 2.1 eV, a high light-emission efficiency can be obtained. The minimum excited triplet energy (T1) means a peak energy of a light emission band corresponding to the transition between the minimum vibration bands of the phosphorescent light-emitting spectrum observed at a temperature of liquid nitrogen or a temperature of liquid helium, by dissolving the host compound in a solvent.

Moreover, the host compound of the light-emitting layer which contains the phosphorescent light-emitting dopant preferably has a larger minimum excited triplet energy (T1) than that of the adjacent positive hole transport layer.

Specific examples of the known host compound used in the organic EL element and the like include compounds described in the following documents, and the like, and are not limited thereto.

JP 2001-257076 A, JP 2002-308855 A, JP 2001-313179 A, JP 2002-319491 A, JP 2001-357977 A, JP 2002-334786 A, JP 2002-8860 A, JP 2002-334787 A, JP 2002-15871 A, JP 2002-334788 A, JP 2002-43056 A, JP 2002-334789 A, JP 2002-75645 A, JP 2002-338579 A, JP 2002-105445 A, JP 2002-343568 A, JP 2002-141173 A, JP 2002-352957 A, JP 2002-203683 A, JP2002-363227A, JP2002-231453A, JP2003-3165A, JP2002-234888A, JP2003-27048A, JP2002-255934A, JP2002-260861A, JP2002-280183A, JP2002-299060A, JP2002-302516A, JP2002-305083A, JP2002-305084A, JP2002-308837A, US20030175553A, US20060280965A, US20050112407A, US20090017330A, US20090030202A, US20050238919A, WO2001039234A, WO2009021126A, WO2008056746A, WO2004093207A, WO2005089025A, WO2007063796A, WO2007063754A, WO2004107822A, WO2005030900A, WO2006114966A, WO2009086028A, WO2009003898A, WO2012023947A, JP2008-074939A, JP2007-254297A, EP2034538A, and the like.

[Electron Transport Layer]

The electron transport layer used in the organic EL element is constituted of a material having a function of transporting an electron, and has a function of transmitting an electron injected from the cathode to the light-emitting layer.

The electron transport material may be used alone or in combination of two or more kinds.

The total thickness of the electron transport layer is not particularly limited, and is usually in the range of 2 nm to 5 μm, more preferably 2 nm to 500 nm, and further preferably 5 nm to 200 nm.

In addition, in the organic EL element, it is known that, when extracting the light generated in the light-emitting layer, the light directly extracted from the light-emitting layer through the anode and the light extracted after reflection on the cathode positioned on the side opposite to the anode interfere with each other.

Accordingly, in the organic EL element, the regulation of the total thickness of the light-emitting unit is preferably carried out by optionally regulating the total thickness of the electron transport layer within the range of several nanometers to several micrometers. In contrast, since a voltage becomes easily increased when the thickness of the electron transport layer is increased, an electron mobility of the electron transport layer is preferably $10^{-5}$ cm$^2$/Vs or more in the case where the thickness is particularly large.

The material used in the electron transport layer (hereinafter, referred to as electron transport material) may be a material having any of an electron injecting property, transporting property, and a positive hole barrier property, and an optional material selected from the conventionally known compounds can be used. Examples can include a nitrogen-containing aromatic heterocyclic derivative, an aromatic hydrocarbon cyclic derivative, a benzofuran derivative, a dibenzothiophene derivative, a silole derivative, and the like.

Examples of the above-described nitrogen-containing aromatic heterocyclic derivative include a carbazole derivative, an azacarbazole derivative (one or more of carbon atoms constituting a carbazole ring being substituted by a nitrogen atom), a pyridine derivative, a pyrimidine derivative, a pyrazine derivative, a pyridazine derivative, a triazine derivative, a quinoline derivative, a quinoxaline derivative, a phenanthroline derivative, an azatriphenylene derivative, an oxazole derivative, a triazole derivative, an oxadiazole derivative, a thiadiazole derivative, a triazole derivative, a benzimidazole derivative, a benzoxazole derivative, a benzothiazole derivative, and the like.

Examples of the aromatic hydrocarbon cyclic derivative include a naphthalene derivative, an anthracene derivative, triphenylene, and the like.

Furthermore, a metal complex having a quinolinol structure or a benzoquinolinol structure as a ligand, for example, tris(8-quinolinol)aluminum (Alq3), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq), and the like, and a metal complex where the main metal of those metal complexes are replaced by In, Mg, Cu, Ca, Sn, Ga or Pb may be used as the electron transport material.

Moreover, a metal-free or metal phthalocyanine or one that the ends thereof are substituted by an alkyl group or sulfonic acid residue may also be used as the electron transport material. In addition, the distyrylprazine derivative exemplified as the material for the light-emitting layer may also be used as the electron transport material, and, similar to the positive hole injection layer and the positive hole transport layer, an inorganic semiconductor such as n type-Si or n type-SiC may also be used as the electron transport material.

Further, a polymeric material where those materials are introduced into a polymeric chain or those materials are constituted of a main chain may also be used.

In the organic EL element, an electron transport layer having a high n property (electron rich) may be formed by doping a doping material into the electron transport layer as a guest material. Examples of the doping material include a metal compound such as a metal complex or a halogenized metal, or other n type dopants. Specific examples of the electron transport layer having such configuration include one described in JP 04-297076 A, JP 10-270172 A, JP 2000-196140 A, JP 2001-102175 A, J. Appl. Phys., 95,5773 (2004), and the like.

Examples of the known preferable electron transport material include compounds described in the following documents, and the like, and are not limited thereto.

U.S. Pat. Nos. 6,528,187 B, 7,230,107 B, US 2005/0025993 A, US 2004/0036077 A, US 2009/0115316 A, US 2009/0101870 A, US 2009/0179554 A, WO 2003/060956 A, WO2008/132085A, Appl. Phys. Lett. 75, 4 (1999), Appl. Phys. Lett. 79, 449 (2001), Appl. Phys. Lett. 81, 162 (2002), Appl. Phys. Lett. 81, 162 (2002), Appl. Phys. Lett. 79, 156 (2001), U.S. Pat. No. 7,964,293 B, US 2009/030202 A, WO 2004/080975 A, WO 2004/063159 A, WO 2005/085387 A, WO 2006/067931 A, WO 2007/086552 A, WO 2008/114690 A, WO 2009/069442 A, WO 2009/066779 A, WO 2009/

054253 A, WO 2011/086935 A, WO 2010/150593 A, WO 2010/047707 A, EP 2311826 A, JP 2010-251675 A, JP 2009-209133 A, JP 2009-124114 A, JP 2008-277810 A, JP 2006-156445 A, JP 2005-340122 A, JP 2003-45662 A, JP 2003-31367 A, JP 2003-282270 A, WO 2012115034 A, and the like Examples of more preferable electron transport material include a pyridine derivative, a pyrimidine derivative, a pyradine derivative, a triadine derivative, a dibenzofran derivative, a dibenzothiazole derivative, a carbazole derivative, an azacarbazole derivative, a benzimidazole derivative.

[Positive Hole Blocking Layer]

The positive hole blocking layer is a layer having a function of the electron transport layer in a broad sense, and preferably is constituted of a material which has a low capability of transporting a positive hole while having a function of transporting an electron. A probability of recombination of an electron and a positive hole can be enhanced by blocking the positive hole while transporting the electron.

It is more effective for the positive hole layer to have a function as a layer that blocks a triplet energy.

Furthermore, the above-described configuration of the electron transport layer may be used as that of the positive hole blocking layer as necessary.

The positive hole blocking layer provided in the organic EL element is preferably provided adjacent to the cathode side of the light-emitting layer.

The thickness of the positive hole blocking layer in the organic EL element is preferably within the range of 3 to 100 nm, more preferably within the range of 5 to 30 nm.

The material used for the positive hole blocking layer is preferably the material used for the above-described electron transport layer, and also the material used as the above-described host compound may preferably be used for the positive hole blocking layer.

[Electron Injection Layer]

The electron injection layer (also referred to as "cathode buffer layer") is a layer provided between the cathode and the light-emitting layer in order to lower a driving voltage and to improve a light emission brightness. One example of the electron injection layer is described in "Organic EL element and its Industrial Frontline (Nov. 30, 1998, published by NTS)", Part 2, Chapter 2 "Electrode Material" (pp 123-166).

In the organic EL element, the electron injection layer is provided as necessary, and as described above, is provided between the cathode and the light-emitting layer, or between the cathode and the electron transport layer.

It is preferable that the electron injection layer is an extremely thin film, and the thickness thereof is within the range of 0.1 nm to 5 nm although the thickness depends on the material thereof, or may be a uniform film in which the structural material exists intermittently.

The electron injection layer is also described in detail in JP 06-325871 A, JP 09-17574 A, JP 10-74586 A, and the like. Specific examples of the material used preferably for the electron injection layer include a metal represented by strontium, aluminum, an alkali metal compound represented by lithium fluoride, sodium fluoride, potassium fluoride, an alkaline earth metal compound represented by magnesium fluoride, calcium fluoride, a metal oxide represented by aluminum oxide, a metal complex represented by lithium 8-hydroxyquinolate (Liq), and the like. In addition, the above-described electron transport material may be also used.

Furthermore, the material used for the above-described electron injection layer may be alone or in combination of two or more kinds.

[Positive Hole Transport Layer]

The positive hole transport layer is constituted of a material having a function of transporting a positive hole, and has a function of transmitting a positive hole injected from the anode to the light-emitting layer.

The total film thickness of the positive hole transport layer in the organic EL element is not particularly limited, and is usually the range of 5 nm to 5 μm, more preferably 2 nm to 500 nm, and further preferably 5 nm to 200 nm.

The material used in the positive hole transport layer (hereinafter, referred to as positive hole transport material) may be a material having any of a positive hole injecting property, transporting property, and an electron barrier property. The positive hole transport material may be used by selection from the conventionally known compounds optionally. The positive hole transport material may be used alone or in combination of two or more kinds.

Examples of the positive hole transport material include a porphyrin derivative, a phthalocyanine derivative, an oxazole derivative, an oxadiazole derivative, a triazole derivative, an imidazole derivative, a pyrazoline derivative, a pyrazolone derivative, a phenylenediamine derivative, a hydrazine derivative, a styrbene derivative, a polyarylalkan derivative, a triarylamine derivative, a carbazole derivative, an indlocarbazole derivative, an isoindole derivative, an acene-based derivative such as anthracene or naphtharene, a fluorine derivative, a fluorenon derivative, polyvinylcarbazole, a polymer or oligomer material having an aromatic amine at the main chain or side chain, polysilane, conductive polymer, an electrically conductive polymer or an oligomer (for example, PEDOT: PSS, an aniline-based copolymer, polyaniline, polythiofen, and the like.

Examples of the triarylamine derivative include a benzidine type represented by α-NPD, a star-burst type represented by MTDATA, a compound having fluorene or anthracene at a triarylamine linkage core portion.

In addition, a hexaazatriphenylene derivative described in JP 2003-519432 A and JP 2006-135145 A may be used as the positive hole transport material.

Furthermore, it is also possible to use a positive hole transport layer having a high p property obtained by doping a contaminant. For example, it is also possible to apply the configuration described in JP 04-297076 A, JP 2000-196140 A, JP2001-102175A, J. Appl. Phys., 95,5773(2004), and the like to the positive hole transport layer.

In addition, there may be used an inorganic compound such as a so-called p type positive hole transport material, p type-Si, p type-SiC described in JP 11-251067 A, J. Huang et. al. Applied Physics Letters 80(2002), p. 139. Furthermore, an ortho-metallized organometal complex having Ir or Pt as a center metal represented by Ir(ppy)$_3$.

Although the above-described compounds can be used as the positive hole transport material, preferable is a triarylamine derivative, a carbazole derivative, indolocarbazole derivative, an azatriphenylene derivative, an organometal complex, a polymer or oligomer in which an aromatic amine is introduced into a main chain or a side chain.

Examples of the positive hole transport material include compounds described in the following documents other than the above-described documents, and are not limited thereto.

Appl. Phys. Lett. 69, 2160 (1996), J. Lumin. 72-74, 985 (1997), Appl. Phys. Lett. 78, 673 (2001), Appl. Phys. Lett. 90, 183503 (2007), Appl. Phys. Lett. 90, 183503 (2007), Appl. Phys. Lett. 51, 913 (1987), Synth. Met. 87, 171 (1997), Synth. Met. 91, 209 (1997), Synth. Met. 111,421 (2000), SID Symposium Digest, 37, 923 (2006), J. Mater. Chem. 3, 319 (1993), Adv. Mater. 6, 677 (1994), Chem. Mater. 15,3148 (2003), US20030162053A, US20020158242A, US20060240279A, US20080220265A, U.S. Pat. No. 5,061,569B, WO2007002683A, WO2009018009A, EP650955A, US20080124572A, US20070278938A, US20080106190A, US20080018221A, WO2012115034A, JP2003-519432A, JP2006-135145A, U.S. Ser. No. 13/585,981

[Electron Blocking Layer]

The electron blocking layer is a layer having a function of the positive hole transport layer in a broad sense, and preferably is constituted of a material which has a low capability of transporting an electron while having a function of transporting a positive hole. A probability of recombination of the electron and the positive hole can be improved by blocking an electron while transporting a positive hole, in the electron transport layer.

Furthermore, the configuration of the above-described positive hole transport layer can be used as that of the electron blocking layer of the organic EL element as necessary.

The electron blocking layer provided in the organic EL element is preferably provided adjacent to the anode side of the light-emitting layer.

The thickness of the electron blocking layer is preferably within the range of 3 to 100 nm, more preferably within the range of 5 to 30 nm.

The material used for the electron blocking layer is preferably the material used for the above-described positive hole transport layer. In addition, the material used as the above-described host compound can be preferably used for the electron blocking layer.

[Positive Hole Injection Layer]

The positive hole injection layer (also referred to as "anode buffer layer") is a layer provided between the anode and the light-emitting layer in order to lower a driving voltage and to enhance a light emission brightness. One example of the positive hole injection layer is described in "Organic EL element and its Industrial Frontline (Nov. 30, 1998, published by NTS)", Part 2, Chapter 2 "Electrode Material" (pp 123-166).

The positive hole injection layer is provided as necessary, and as described above, is provided between the anode and the light-emitting layer, or between the anode and the positive hole transport layer.

The positive hole injection layer is also described in detail in JP 09-45479 A, JP 09-260062 A, JP 08-288069 A, and the like.

The material used for the positive hole injection layer is, for example, the above-described material used for the positive hole transport layer, and the like. Among them, the materials include preferably a phthalocyanine derivative represented by copper phthalocyanine; a hexaazatriphenylene derivative described in JP 2003-519432 W and JP 2006-135145 A, or the like; a metal oxide represented by vanadium oxide; an electrically conductive polymer such as amorphous carbon, polyaniline (emeraldine) or polythiophene; an orthometalized complex represented by tris(2-phenylprydine)iridium or the like; a triarylamine derivative; and the like.

The material used for the above-described positive hole injection layer may be alone or in combination of two or more kinds.

[Contents]

The light-emitting unit constituting the organic EL element may further contain other contained materials.

Examples of the contained materials include a halogen element or a halogenated compound such as bromine, iodine or chlorine; a compound, complex, salt of an alkali metal or an alkali earth metal, a transition metal such as Pd, Ca and Na; and the like.

Although a content of the contained materials can be optionally determined, the content is preferably 1000 ppm or less relative to the whole mass % of the contained layers, more preferably 500 ppm or less, and further preferably 50 ppm or less.

However, the content is not within that range, depending on the purpose of enhancing the transportability of the electron and the positive hole, or the purpose of making the energy transfer of the exciton advantageous.

[Intermediate Connector Layer]

When the above-described light-emitting units are laminated, it is preferable to provide the non-emissive intermediate connector layer 19 between the light-emitting units. The intermediate connector layer 19 is a layer having an interface with an organic compound layer which electrically connects a plurality of the light-emitting units in series, in electric field.

An organic compound or an inorganic compound can be used alone or by mixing two or more kinds, as the intermediate connector layer 19.

The intermediate connector layer 19 is formed by at least one layer, preferably two or more, and particularly preferably includes one or both of a p-type semiconductor layer and an n-type semiconductor layer. Furthermore, the intermediate connector layer 19 may be a bipolar layer which can generate and transport a positive hole and an electron inside the layer by an external electric field. Moreover, a metal, a metal oxide, and an alloy thereof which can be used as a usual electrode material can be suitably used.

As explained above, the intermediate connector layer 19 can be configured as an electric charge generation layer which has a function of injecting an electron to one light-emitting unit, and has a function of injecting a positive hole to the other light-emitting unit.

In addition, it is possible to form the intermediate connector layer 19 by using the same materials as those of the anode and the cathode. Furthermore, it is possible to form the intermediate connector layer 19 by using a material having a lower electric conductivity than those of the anode and the cathode.

In the intermediate connector layer 19, for example, an insulating body such as lithium oxide, lithium fluoride, or cesium carbonate, or a semiconductor can be used for the layer having a function of injecting an electron. Alternatively, it is also possible to use a material in which an electron donative substance is added to a substance having a high electron transport property.

Examples of the organic compound include a nano-carbon material, an organometal complex compound which has a function as an organic semiconductor material (organic acceptor, organic donor), an organic salt, an aromatic hydrocarbon compound, and a derivative thereof, a hetero aromatic hydrocarbon compound, a derivative thereof, and the like.

Examples of the inorganic compound include a metal, or an inorganic oxide, an inorganic salt, and the like.

There can be used, as the substance having a high electron transport property, a metal complex and the like having a quinoline structure or benzoquinoline structure such as tris (8-quinolinolato)aluminum (abbreviation: Alq3), tris(4-methyl-8-quinolinolato)aluminum (abbreviation: Almq3), bis (10-hydroxybenzo[h]quinolinato)beryllium (abbreviation: BeBq2), or bis(2-methyl-8quinolinolato)(4-phenylphenolato)aluminum (abbreviation: BAlq).

In addition, there can also be used a metal complex having an oxazole-based or thiazole-based ligand such as bis[2-(2-hydroxyphenyl)benzothiazolato]zinc (abbreviation: Zn(BOX)2), or bis[2-(2-hydroxyphenyl)benzoxazolato]zinc (abbreviation: Zn(BTZ)2).

Furthermore, also other than the metal complex, there can also be used 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-biphenylyl)-4-phenyl-5-(4-tert-butylohenyl)-1,2,4-triazole (abbreviation: TAZ), bathophenathroline (abbreviation: BPhen), bathocuproine (abbreviation: BCP), and the like.

The above-described substance having a high electron transporting ability has mainly an electron mobility of $10^{-6}$ cm$^2$/Vs or more. Note that, when a substance having an electron transporting property higher than that of the positive hole, substances other than the above-described substances can also be used.

The electron injecting property can be enhanced by adding an electron donative substance to the substance having a high electron transporting property. Therefore, a drive voltage of the light-emitting element can be lowered. There can be used, as the electron donative substance, an alkali metal, an alkali earth metal or a rare earth metal, a metal of Group 13 of Periodic table, an oxide thereof, or a carbonate thereof. Specifically, there can be used lithium (Li), cesium (Cs), magnesium (Mg), calcium (Ca), ytterbium (Yb), indium (In), lithium oxide, cesium carbonate, and the like. Furthermore, an organic compound such as tetrathianaphthacene may be used as a donor substance.

Moreover, a semiconductor such as molybdenum oxide, vanadium oxide, rhenium oxide or ruthenium oxide, and an insulation body can be used as the layer having a function of injecting the positive hole in the intermediate connector layer 19. Alternatively, there can be used a material in which an electron receptive substance is added to the substance having a high positive hole transporting property. Furthermore, a layer formed of an electron receptive substance may be used.

There can be used, as the substance having a high positive hole transporting property, an aromatic amine compound and the like such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), or 4,4',4"-tris[N-(3-methylphenyl)-N-phenylamino)triphenylamine (abbreviation: MTDATA).

The above-described substance having a high positive hole transporting ability has mainly a positive hole mobility of $10^{-6}$ cm$^2$/Vs or more. However, when the substance is one having a positive hole transporting property higher than that of the electron, substances other than the above-described substances may be used. In addition, the above-described host materials may be used.

The positive hole injecting property can be enhanced by adding an electron receptive substance to the substance having a high positive hole transporting property. Therefore, a drive voltage of the light-emitting element can be lowered. There can be used, as the electron receptive substance, 7,7,8,8-tetracyano-2,3,5,6-tetrafluoroquinodimethane (abbreviation: F4-TCNQ), chloranil, and the like. In addition, a transition metal oxide can also be used. Furthermore, an oxide of a metal of Group 4 to Group 8 in Periodic table can be used. Specifically, vanadium oxide, niobium oxide, tantalum oxide, chromium oxide, molybdenum oxide, tungsten oxide, manganese oxide, or rhenium oxide is preferable because of high electron receptivity. Among them, molybdenum oxide is preferable because it is stable in the atmospheric circumstance, has a low hydroscopic property, and is easily handled.

It is possible to suppress the elevation of the drive voltage even when the film thickness of the intermediate connector layer 19 is enlarged, by employing any one or both of the configuration in which the electron receptive substance is added to the substance having a high positive hole transporting property and the configuration in which the electron receptive substance is added to the substance having a high electron transporting property. Therefore, a short-circuit due to a fine particle and impact can be prevented by enlarging the film thickness of the intermediate connector layer 19, and thus it is possible to obtain a highly reliable light-emitting element without elevating the drive voltage.

In the intermediate connector layer 19, other layer may be introduced, as necessary, between the layer having a function of injecting the positive hole and the layer having a function of injecting the electron. For example, an electrically conductive layer such as ITO and an electronic relay layer may be provided. The electronic relay layer has a function of diminishing a voltage loss generated between the layer having a function of injecting the positive hole and the layer having a function of injecting the electron. Specifically, a material having a LUMO level of approximately −5.0 eV or more is preferably used, and more preferably used is not less than −5.0 eV and not more than −3.0 eV. For example, 3,4,9,10-perylenetetracarboxylic dianhydride (abbreviation: PTCDA), 3,4,9,10-perylenetetracarboxylic bisbenzoimidazole (abbreviation: PTCBI), and the like may be used.

[Anode]

As the anode 21 in the organic EL element 10, there may be used an electrode substance such as a metal, an alloy, an electrically conductive compound, and a mixture thereof which have a large work function (4 eV or more, preferably 4.3 V or more). Examples of the electrode substance include a metal such as Au or Ag, and an alloy thereof, a conductive transparent material such as CuI, indium tin oxide (ITO), SnO$_2$ or ZnO. Furthermore, a material which can produce an amorphous transparent film such as IDIXO (In$_2$O$_3$—ZnO) may be used.

The anode 21 can be formed as a thin electrode substance film by using a method such as a vapor deposition or a sputtering, and a desired pattern may be formed by a photolithography method. When an accurate pattern is not necessarily required (around 100 μm or more), a pattern may be formed through a desired mask pattern at the vapor deposition or sputtering of the electrode substance.

When using a substance which can be coated, such as an organic conductive compound, a wet film-forming method such as a printing method or a coating method can be employed.

When extracting emitting light from the anode 21, it is desirable to make a transparency large than 10%. A sheet resistance as the anode is preferably hundreds Ω/sq. or less. A thickness of the anode is selected, depending on the materials, usually within the range of 10 nm to 1 μm, preferably 10 nm to 200 nm.

[Cathode]

There may be used, as the cathode 22, an electrode substance such as a metal (referred to as electron injecting metal), an alloy, an electrically conductive compound, and a mixture thereof which have a small work function (4 eV or less). Examples of such an electrode substance include sodium, sodium-potassium alloy, magnesium, lithium, magnesium/copper mixture, magnesium/silver mixture, magnesium/aluminum mixture, magnesium/indium mixture, aluminum/aluminum oxide (Al$_2$O$_3$) mixture, indium, lithium/aluminum mixture, aluminum, silver, an alloy mainly containing silver, aluminum/silver mixture, a rare earth metal, and the like.

The cathode 22 can be produced using the above-described electrode substance and using a method of a vapor deposition or a sputtering. In addition, a sheet resistance of the cathode 22 is preferably hundreds Ω/sq. or less. Furthermore, a thickness of the cathode 22 is selected usually within the range of 10 nm to 5 μm, preferably 50 nm to 200 nm.

[Substrate]

The substrate 23 used for the organic EL element 10 is not particularly limited to the kind of a glass, a plastic or the like, and may be transparent or opaque. In the case of extracting light from the supporting substrate, the supporting substrate is preferably transparent.

Preferred transparent supporting substrate can include a glass, a quartz, a transparent resin film. Particularly preferable supporting substrate is a resin film which can impart flexibility to the organic EL element 10.

Examples of the resin film include a polyester such as polyethylene terephthalate (PET) or polyethylene naphthalate (PEN); polyethylene; polypropylene; a cellulose esters such as cellophane, cellulose diacetate, cellulose triacetate (TAC), cellulose acetate butylate, cellulose acetate propionate (CAP), cellulose acetate phthalate, cellulose nitrate, or a derivative thereof; polyvinylidene chloride; polyvinyl alcohol; polyethylene vinyl alcohol; syndiotactic polystyrene; polycarbonate; norbornene resin; polymethylpentene; polyether ketone; polyimide; polyether sulfone (PES); polyphenylene sulfide; polysulfones; polyether imode; polyether ketone imide; polyamide; a fluororesin; Nylon; polymethyl methacrylate; acryl or polyallylates; a cycloolefin-based resin such as ARTON (Trade name, manufactured by JSR) or APEL (Trade name, manufactured by MITSUI CHRMICAL INC.), and the like.

A barrier film of a coating film of an inorganic or organic material, or a hybrid coating film of the both may be formed on the surface of the resin film. Preferable barrier film is a barrier film having a moisture permeability (25±0.5° C., relative humidity (90±2)% RH) measured by the method in accordance with JIS K 7129-1992 of 0.01 g/(m²·24 h) or less. Furthermore, preferable barrier film is a high barrier film having an oxygen permeability measured by the method in accordance with JIS K 7126-1987 of $10^{-3}$ ml/(m²·24 h·atm) or less, and a moisture permeability of $10^{-5}$ g/(m²·24 h) or less.

The material forming the barrier film may be a material having a function of suppressing intrusion of a substance which degrades the element such as moisture or oxygen. For examples, silicon oxide, silicon dioxide, silicon nitride and the like can be used. Furthermore, in order to improve fragility of the barrier film, it is more preferable to impart a laminated structure of the inorganic layer and a layer formed of an organic material. The lamination order of the inorganic layer and the organic layer is not particularly limited, and it is preferable to laminate the both alternately a plurality of times.

The method of forming the barrier film is not particularly limited, and for example, there can be employed a vacuum vapor deposition method, a spattering method, a reactive sputtering method, a molecular beam epitaxy method, a cluster ion beam method, an ion plating method, a plasma polymerization method, an atmospheric plasma polymerization method, a plasma CVD method, a laser CVD method, a heat CVD method, coating method, and the like. For example, it is preferable to use the atmospheric plasma polymerization method as described in JP 2004-68143 A.

Examples of the opaque supporting substrate include, for example, a metal plate or film of aluminum, stainless steel, or the like, an opaque resin plate, a substrate of ceramics, and the like.

[Sealing]

A sealing means used for sealing the organic EL element 10 is a method for causing, for example, a sealing member, the electrodes and the supporting substrate to adhere with an adhesive.

The sealing member may be arranged so as to cover the display region of the organic EL element, and may be concave or flat. In addition, a transparency and electric insulating property are not particularly limited.

Specific examples include a glass plate, a polymer plate, a polymer film, a metal plate or film, and the like.

Examples of the glass plate can include particularly soda-lime glass, barium- and strontium-containing glass, lead glass, alumino-silica glass, borosilicate glass, barium borosilicate glass, quartz, and the like.

Furthermore, examples of the polymer plate and polymer film can include polycarbonate, acryl, polyethylene terephthalate, polyether sulfone, polysulfone, and the like.

Examples of the metal plate include a metal or alloy containing at least one selected from the group consisting of stainless steel, iron, copper, aluminum, magnesium, nickel, zinc, chromium, titanium, molybdenum, silicon, germanium and tantalum.

The polymer film and the metal film can preferably be used because the organic EL element 10 can be made thin film. Furthermore, the polymer film preferably has an oxygen permeability of $10^{-3}$ ml/(m²·24 h) or less, and a moisture permeability of $10^{-3}$ g/(m²·24 h) or less. Moreover, both of the oxygen permeability and the moisture permeability are more preferably $10^{-5}$ ml/(m²·24 h) or less.

For processing the sealing member in the concaved shape, sandblast processing, chemical etching processing, or the like is employed. Examples of the adhesive can include a photo-curable and thermosetting adhesive having a reactive vinyl group such as an acrylic acid-based oligomer or a methacrylic acid-based oligomer, a moisture-curable adhesive such as 2-cyanoacrylic acid ester. In addition, a thermally or chemically curable (two-liquid mixing) adhesive can be included. Furthermore, a hot-melt type polyamide, polyester, and polyolefin can be included. Moreover, an ultraviolet curable epoxy resin adhesive of cationic curable type can be included.

Since in the case where the organic EL element is degraded by the heat treatment, it is preferable to carry out adherence and curing at a temperature of room temperature to 80° C. In addition, a dry agent may be incorporated in the adhesive. The application to the part to be sealed is carried out by using a commercially available dispenser or printing like screen printing.

It is preferable that a gap between the sealing member and the display region of the organic EL element is filled with a gas and a liquid, an inert gas such as nitrogen or argon, an inert liquid such as a fluorinated hydrocarbon or silicon oil. In addition, it is possible to be in vacuum state. Furthermore, a moisture absorbing compound can be injected inside thereof.

Examples of the moisture absorbing compound include a metal oxide (for example, sodium oxide, potassium oxide, calcium oxide, barium oxide, magnesium oxide, aluminum oxide, and the like), a sulfate (for example, sodium sulfate, calcium sulfate, magnesium sulfate, cobalt sulfate, and the like), a metal halide (for example, calcium chloride, magnesium chloride, cesium fluoride, tantalum fluoride, cerium bromide, magnesium bromide, barium iodide, magnesium iodide, and the like), a perchloric acid (for example, barium perchlorate, magnesium perchlorate, and the like), and the like. As to the sulfate, the metal halide and the perchloric acid, an acid anhydride is suitable used.

(Protective Film, Protective Plate)

In order to enhance the mechanical strength of the element, a protective film or a protective plate may be provided on the outside of the above-described sealing film. Particularly in the case where the sealing is done by the above-described sealing film, since the mechanical strength thereof is not so good, it is preferable to provide such protective film, protective plate. The material to be used for is the same as those for sealing such as a glass plate, a polymer plate or film, a metal plate or polymer film, and the like. Among them, the polymer film is preferably used in view of right weight and thin film formation.

[Technique of Improving Extraction of Light]

In the organic EL element, it is generally said that since the light emission is happened in a layer having a higher refractive index (within the range of refractive index of around 1.6 to 2.1) than an air, 15 to 20% of the emitted light in the light-emitting layer can be extracted. This is because light entered to an interface (interface of transparent substrate and air) at an angle θ larger than a critical angle is totally reflected and cannot be extracted to the outside of the element, and light is totally reflected between a transparent electrode or a light-emitting layer and a transparent substrate to conduct through the transparent electrode or the light-emitting layer, and then to run away to the side wall of the element.

As methods to improve the light extraction efficiency, there have been proposed, for example, a method where the total reflection on the interface of the transparent substrate and the air is protected by forming on the surface of the transparent substrate (for example, U.S. Pat. No. 4,774,435B), a method where an efficiency is improved by giving the substrate the light-concentration property (for example, JP63-314795A), a method where reflective surfaces are formed on the side walls of the element (for example, JP1-220394A), a method where a flat layer having an intermediate refractive index is provided between the transparent electrode and the light-emitting layer to form an antireflective film (for example, JP62-172691A), a method where a flat layer having a lower refractive index than the substrate is provided between the substrate and the light emitting body (for example, JP2001-202827A), a method where a diffraction grating is formed between the substrate, the transparent electrode and the light-emitting layer (including between the substrate and the outside) (JP11-283751A), and the like.

[Production Method of Organic EL Element]

Next, one example of the production method of an organic EL element 10 showing in FIG. 1 comprising anode 21/first light-emitting unit 11/intermediate connector layer 19/second light-emitting unit 12/cathode 22 will be explained.

First, an anode 21 is produced by forming, on an adequate substrate 23, a thin film constituted of a desired electrode substance, for example, a substance for an anode so as to have a film thickness of 1 μm or less, preferably 10 to 200 nm, by a method such as vapor deposition or sputtering.

Next, a first light-emitting unit 11 constituted of a first positive hole transport layer 13, a first light-emitting layer 14 and a first electron transport layer 15 which are materials of the organic EL element 10 is formed on the anode.

Examples of the method for forming the thin film of the organic compound include a vapor deposition method, a wet process (spin coating method, casting method, inkjet method, printing method, LB (Langmuir-Blodgett method), spraying method, printing method, slot-type coater method), and the like; and from the viewpoint of easily obtaining a homogeneous film and of being less likely to generate a pin hole, a vacuum vapor deposition method, a spin coating method, an inkjet method, a printing method, and a slot-type coater method are particularly preferable.

Furthermore, a different film-forming method may be applied to each layer.

When adopting the vapor deposition method as the film-formation, the vapor deposition conditions are different depending on the kinds of the compound to be used, and it is desirable to appropriately select generally the condition within the range of a boat heat temperature of 50° C. to 450° C., a degree of vacuum of $10^{-6}$ Pa to $10^{-2}$ Pa, a vapor deposition speed, a vapor deposition rate of 0.01 nm/sec to 50 nm/sec, a substrate temperature of −50° C. to 300° C., a film thickness of 0.1 nm to 5 μm, preferably 5 nm to 200 nm.

Next, the intermediate connector layer 19 is formed on the first light-emitting unit 11.

The method of forming the intermediate connector layer 19 is not particularly limited as long as a thin film can be formed in the electric charge generation layer and the intermediate electrode as described above, and the examples thereof include a vapor deposition method, a sputtering method, a wet process (a spin coating method, a n LB method, a splay method, a printing method, a slot-type coater method), and the like.

Subsequently, there is formed, on the intermediate connector layer 19, the second light-emitting unit 12 which is a material of the organic EL element 10 and which is constituted of the second positive hole transport layer 16, the second light-emitting layer 17, and the second electron transport layer 18.

Thin film formation may be carried out by the above-described known method, as the method of forming the second light-emitting unit 12, and the second light-emitting unit 12 can be produced by a method of using a shadow mask in the case of the vapor deposition method, a patterning by the printing method in the case of the wet process, and the like, as the patterning method.

After forming these layers, a thin layer constituted of a substance for the cathode is formed on the layers so as to be a thickness of the range of 1 μm or less, preferably 50 to 200 nm by, for example, the vapor deposition or sputtering method to provide the cathode 22.

Accordingly, the desired organic EL element 10 can be obtained.

The production of the organic EL element 10 is preferably carried out by producing the first light-emitting unit 11 to the cathode 22 consistently under one vacuum processing, and may be carried out by taking out the element on the way and applying a different film-forming method. At that time, the procedures should be conducted under a dry inert gas atmosphere.

After that, the organic EL element 10 may be sealed and protected.

For example, the organic EL element is sealed by coating the organic EL element in the state that a part or the whole of the anode and the cathode with a thermosetting resin and then the resin is cured with heating.

After that, the sealed organic EL element and the exposed part or the whole of the anode and the cathode of the organic EL element is covered by a protective member, and then heated and pressed the overlapped parts of the protective member at a given temperature. The heating and pressing may be carried out by sandwiching the sealed organic EL element, and the like with two protective members and then heating and pressing the edges of the protective members, or by covering the sealed organic EL element 10, and the like so as to fold with one protective member, and then heating and pressing the edges (particularly open edges) each other.

According to the above-described procedures, an organic EL module where the organic EL element 10 is sealed and protected is produced.

[Other Configurations]

Note that, in the above first embodiment, although the bottom emission-type organic EL element in which the anode serving as a transparent electrode, the first light-emitting unit, the intermediate connector, the second light-emitting unit, and the cathode serving as a reflective electrode are laminated in order from the substrate side, the configuration is not limited thereto, and, for example, the order of the lamination may be reversed, and the configuration of the anode and the cathode may be reversed.

In addition, the organic EL element may have at least two light-emitting layers. Then, in each light-emitting layer, there is employed the configuration in which a layer having a shallow LUMO and a high T1 is provided on the anode side of the light-emitting layer where the reduction in brightness may easily happen generally, and in which a layer satisfying at least one of a deep LUMO and a low T1 is provided on the anode side of the light-emitting layer where the reduction in brightness may hardly happen generally. Thereby, the balance of the reduction in brightness of each light-emitting layer can be regulated, and the lowering of quality of the white light extracted from the organic EL element can be suppressed.

Accordingly, if the above-described conditions of the layer configuration are satisfied, the configuration of layer and the number of laminated layers of the light-emitting unit, and the configuration of layer and the number of laminated layers of the light-emitting layer are not particularly limited, any configuration of being able to realize a desired organic EL element can be employed. For example, the light-emitting unit constituting the organic EL element maybe one layer, or the light-emitting unit may be constituted of three or more layers. Furthermore, in the light-emitting unit, the light-emitting layer may be a single layer, or may have a configuration of a plurality of layers laminated directly or via an organic layer.

It is possible to employ a combined configuration thereof appropriately.

Moreover, in the above embodiment, the kinds of light-emitting dopants used in the organic EL element are shown as three kinds of blue, green, and red colors, but light-emitting dopants having other light-emitting colors can also be used. For example, there may be used light-emitting dopants having light-emitting colors being complimentary colors of respective colors of blue, green, and red. The light-emitting layer may have any light-emitting dopant as long as the layer satisfies the above-described relationships of LUMO and T1 is provided between the light-emitting layers having different rates of reduction in brightness and the layer formed on the anode side of the light-emitting layer.

In addition, in the above embodiment, the light-emitting color from the organic EL element is explained as a light emission of white color, but the light-emitting color of the organic EL element is not limited to white color, and any desired light-emitting color by combining a plurality of light-emitting colors from light-emitting layers can be assumed. By the fact that the layer satisfying the above-described relationships of LUMO and T1 is provided between the light-emitting layers having different rates of reduction in brightness and the layer formed on the anode side of the light-emitting layer, the color change from the initial color with the lapse of drive time can be suppressed.

Furthermore, in the above embodiment, the example in which the reduction in brightness of the light-emitting layer on the short wavelength side is large and the reduction in brightness of the light-emitting layer on the long wavelength side is small is explained from the viewpoint of the relation between the light-emitting wavelength and the light-emitting energy, but the magnitude of the reduction in brightness depends on not only the light-emitting wavelength. For example, the rate of reduction in brightness with the lapse of drive time is different depending on the kinds of compounds and laminated configuration of the light-emitting layer regardless of the light-emitting wavelength. Accordingly, the reduction in brightness of the light-emitting layer depends on not only the light-emitting wavelength, but is affected by other configurations.

Also in the configuration in which the reduction in brightness of the light-emitting layer does not depend on the light-emitting wavelength, if there are two or more light-emitting layers and these light-emitting layers have a difference in the magnitude of the reduction in brightness, it is possible to apply the configuration of the organic EL element of the above-described embodiment to thereby suppress the color change from the initial light-emitting color with the lapse of dive time of the organic EL element.

<2. Embodiment of Organic Electroluminescent Element (Second Embodiment)>

Next, the second embodiment of the organic electroluminescent element (organic EL element) will be explained. FIG. 4 shows the configuration of the second embodiment.

[Configuration of Organic EL Element]

The organic EL element 30 shown in FIG. 4 has an anode 36, a light-emitting unit 31, and a cathode 37. In addition, each of these layers are laminated and formed on a substrate 38. The same configuration as the organic EL element of the first embodiment can be applied to the organic EL element 30 of the second embodiment shown in FIG. 4, except that a different configuration is used in the light-emitting unit. In addition, also as to the configuration in the light-emitting unit, only the lamination order and the laminate form are different, and it is possible to apply the same configuration as the above-described first embodiment to each layer constituting the light-emitting unit. Accordingly, in the following explanation, the detailed explanation as to each layer constituting the organic EL element 30 will be omitted.

In the organic EL element 30, the anode 36 is formed on the substrate 38, and the light-emitting unit 31 is formed on the anode 36. Furthermore, the cathode 37 is formed on the light-emitting unit 31.

The above-described organic EL element 30 has a so-called bottom-emission-type configuration in which the anode 36 is constituted of a transparent electrode, the cathode 37 is caused to function as a reflective electrode, and light is extracted from the substrate 38 side.

The light-emitting unit 31 has the configuration in which a positive hole transport layer 32, a first light-emitting layer 33, a second light-emitting layer 34, and an electro transport layer 35 are laminated and formed from the anode 36 in this order.

The positive hole transport layer 32 has a function of transporting a positive hole, and include, in a broad sense, a positive hole injection layer and an electron blocking layer, and the like. Also, the electron transport layer 35 has a function of transporting an electron, and include, in a broad sense, an electron injection layer and a positive hole blocking layer, and the like.

Furthermore, the organic EL element 30 is a white light-emitting element which contains at least a light-emitting organic material, for example, has light-emitting dopants of blue (B), green (G) and red (R) colors in the first light-emitting layer 33 and the second light-emitting layer 34.

In order to enhance the light-emitting efficiency of the organic EL element 30, it is preferable to provide a light-emitting layer which emits light having a short wavelength at the light extraction side. In this sense, in the organic EL element 30 shown in FIG. 4, a light-emitting dopant which emits blue light having a short wavelength is preferably contained in the first light-emitting layer 33. In addition, light-emitting dopants of green (G) and red (R) is preferably contained in the second light-emitting layer 34.

Accordingly, in the organic EL element 30 shown in FIG. 4, the first light-emitting layer 33 is a blue light-emitting layer containing a blue light-emitting dopant, and the second light-emitting layer 34 is a green and red (yellow) light-emitting layer containing a green light-emitting dopant and a red light-emitting dopant.

In the organic EL element 30, the positive hole transport layer 32 is provided as a layer which is contact with the first light-emitting layer 33 on the anode 36 side. Accordingly, the positive hole transport layer 32 is a layer having a shallower LUMO (Lowest Unoccupied Molecular Orbital) and a higher minimum triplet excitation energy (T1) than those of the first light-emitting layer 33.

In the organic EL element 30, the first light-emitting layer 33 is provided as a layer which is contact with the second light-emitting layer 34 on the anode 36 side. Accordingly, the first light-emitting layer 33 is a layer which satisfies at least one of the relations of a deeper LUMO (Lowest Unoccupied Molecular Orbital) and a lower minimum triplet excitation energy (T1) than those of the second light-emitting layer 34.

When employing the above-described configuration, in the first light-emitting layer 33 and the second light-emitting layer 34, the same phenomenon as in the first embodiment is generated. Accordingly, the deterioration of the first light-emitting layer 33 can be suppressed and at the same time, the deterioration of the second light-emitting layer 34 can be promoted. In addition, by regulating the balance of the reduction in brightness between the first light-emitting layer 33 and the second light-emitting layer 34, the lowering of the quality of white light emission of the organic EL element 30 can be suppressed.

Furthermore, as described above, in the configuration of one light-emitting unit and the configuration in which the light-emitting layers are directly laminated to each other, the organic EL element having the same effects as those in the above-described first embodiment can be obtained.

Namely, it is possible to suppress the reduction in brightness of the light-emitting layer by providing a layer having a shallow LUMO and a high T1 on the anode side of the light-emitting layer with generally large reduction in brightness and emitting light having a short wavelength. In addition, it is possible to promote the reduction in brightness of the light-emitting layer by providing a layer which satisfies at least one of a deep LUMO and a low T1 on the anode side of the light-emitting layer with generally small reduction in brightness and emitting light having a long wavelength.

Furthermore, the layer having a shallower LUMO and a higher T1 than those of the light-emitting layer and the layer which satisfies at least one of a deeper LUMO and a lower T1 than those of the light-emitting layer are formed not only as the positive hole transport layer but also as a layer having a light-emitting property. Namely, the layer having a shallower LUMO and a higher T1 than those of the light-emitting layer and the layer which satisfies at least one of a deeper LUMO and a lower T1 than those of the light-emitting layer are not particularly limited in their manner, and when a layer which satisfies this condition, a layer having any configuration can be applied. In addition, with this layer configuration which satisfies the condition, the same effects as the above-described first embodiment can be obtained.

<3. Embodiment of Organic Electroluminescent Element (Third Embodiment)>

Figure 5:
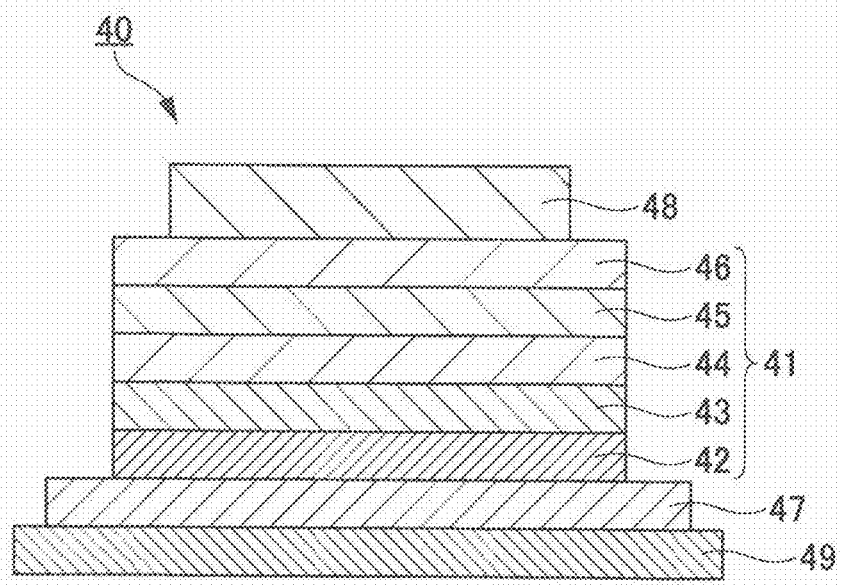
FIG. 5 shows the configuration of the organic EL element of a third embodiment.

Next, the third embodiment of the organic electroluminescent element (organic EL element) will be explained. FIG. 5 shows the configuration of the third embodiment.

[Configuration of Organic EL Element]

The organic EL element 40 shown in FIG. 5 has an anode 47, a light-emitting unit 41, and a cathode 48. In addition, each of these layers are laminated and formed on a substrate 49. The organic EL element 40 of the third embodiment shown in FIG. 5 can apply the same configuration as the organic EL element of the first and the second embodiments, except that the layer configurations in the light-emitting units are different between the organic EL element 40 of the third embodiment and the organic EL element of the first and the second embodiments. In addition, with respect to the configuration in the light-emitting unit, only the lamination order and the laminated form are different, and it is possible to apply the same configuration as the above-described first embodiment and the second embodiment to each layer constituting the light-emitting unit. Accordingly, in the following explanation, the detailed explanation as to each layer constituting the organic EL element 40 is omitted.

In the organic EL element 40, the anode 47 is formed on the substrate 49, and the light-emitting unit 41 is formed on the anode 47. Furthermore, the cathode 48 is formed on the light-emitting unit 41.

The above-described organic EL element 40 has a so-called bottom-emission-type configuration in which the anode 47 is a transparent electrode, the cathode 48 acts as a reflective electrode, and then light is extracted from the substrate 49.

The light-emitting unit 41 has the configuration in which a first organic layer 42, a first light-emitting layer 43, a second organic layer 44, a second light-emitting layer 45, and a third organic layer 46 are laminated and formed from the anode 47 in this order.

The first organic layer 42 has a function of transporting a positive hole, and corresponds to the positive hole transport layer in the first embodiment, and include, in a broad sense, a positive hole injection layer and an electron blocking layer.

The third organic layer 46 has a function of transporting an electron, and corresponds to the electron transport layer in the first embodiment, and include, in a broad sense, an electron injection layer and a positive hole blocking layer, and the like.

The second organic layer 44 is a layer having an interface with an organic compound layer which connects a plurality of light-emitting layers electrically in series. The second organic layer 44 is constituted of at least one organic material layer, and may be a bipolar layer where a positive hole and electron are generated and transported in the layer by applying an external electric field. For example, it is possible to use a material optionally selected from the organic material layer exemplified in the above-described intermediate connector layer and the host compound used for the light-emitting layer.

The first light-emitting layer 43 and the second light-emitting layer 45 may be constructed as that in the first light-emitting layer and the second light-emitting layer in the second embodiment. Accordingly, in the organic EL element 40, the first light-emitting layer 43 is a blue light-emitting layer containing a blue light-emitting dopant, and the second light-emitting layer 45 is a green and red (yellow) light-emitting layer containing a green light-emitting dopant and a red light-emitting dopant.

In the organic EL element 40, the layer which is contact with the first light-emitting layer 43 on the anode 47 side is the first organic layer 42. Accordingly, the first organic layer 42 is a layer having a shallower LUMO (Lowest Unoccupied Molecular Orbital) and a higher minimum triplet excitation energy (T1) than those of the first light-emitting layer 43.

Furthermore, in the organic EL element 40, the layer which is contact with the second light-emitting layer 45 on the anode 47 side is the second organic layer 44. Accordingly, the second organic layer 44 is a layer which satisfies at least one of the relations of a deeper LUMO (Lowest Unoccupied Molecular Orbital) and a lower minimum triplet excitation energy (T1) than those of the second light-emitting layer 45.

When employing the above-described configuration, in the first light-emitting layer 43 and the second light-emitting layer 45, the same phenomenon as in the first embodiment and the second embodiment is generated. Accordingly, the deterioration of the first light-emitting layer 43 can be suppressed and at the same time, the deterioration of the second light-emitting layer 45 can be promoted. In addition, the lowering of the quality of white light emission of the organic EL element 40 can be suppressed by regulating the balance of the reduction in brightness between the first light-emitting layer 43 and the second light-emitting layer 45.

As described above, also in the configuration in which a plurality of light-emitting layers are laminated via the organic layer in one light-emitting unit, the organic EL element having the same effects as those in the above-described first embodiment and second embodiment can be obtained.

Namely, the layer having a shallow LUMO and a high T1 is provided on the anode side of the light-emitting layer with generally large reduction in brightness and emitting light having a short wavelength, and the layer which satisfies at least one of a deep LUMO and a low T1 is provided on the anode side of the light-emitting layer with generally small reduction in brightness and emitting light having a long wavelength. Since, it is possible to regulate the balance of the reduction in brightness of each light-emitting layer by employing the configuration which satisfies the condition, the same effects as in the above-described first embodiment can be obtained.

<4. Embodiment of Organic Electroluminescent Element (fourth Embodiment)>

Figure 6:
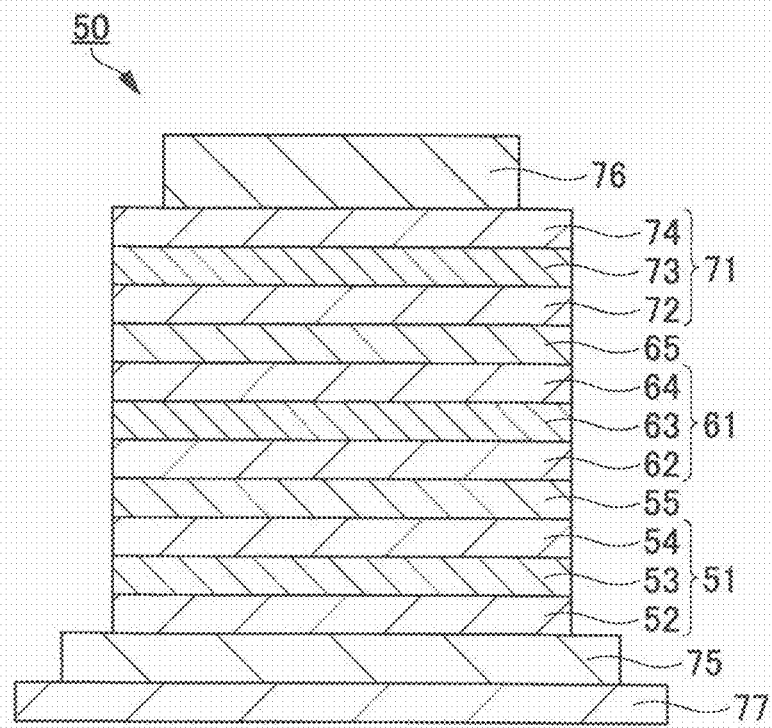
FIG. 6 shows the configuration of the organic EL element of a fourth embodiment.

Next, the fourth embodiment of the organic electroluminescent element (organic EL element) will be explained. FIG. 6 shows the configuration of the organic EL element of the fourth embodiment.

[Configuration of Organic EL Element]

The organic EL element 50 shown in FIG. 6 has an anode 75, a first light-emitting unit 51, a first intermediate connector layer 55, a second light-emitting unit 61, a second intermediate connector layer 65, a third light-emitting unit 71, and a cathode 76. In addition, each of these layers are laminated and formed on a substrate 77.

The organic EL element 50 of the fourth embodiment shown in FIG. 6 can apply the same configuration as the organic EL element of the first embodiment, except that the numbers of the light-emitting unit and the intermediate connector layers are different between the organic EL element 50 of the fourth embodiment and the organic EL element of the first embodiment. In addition, with respect to the configuration in the light-emitting unit and the intermediate connector layer, only the lamination order and the laminated form are different, and it is possible to apply the same configuration as the above-described first embodiment to each layer constituting the light-emitting unit. Accordingly, in the following explanation, the detailed explanation as to each layer constituting the organic EL element 50 is omitted.

In the organic EL element 50, the anode 75 is formed on the substrate 77, and the first light-emitting unit 51 is formed on the anode 75. In addition, the first intermediate connector layer 55 is formed on the first light-emitting layer 51, and the second light-emitting unit 61 is formed on the first intermediate connector layer 55. Furthermore, the second intermediate connector layer 65 is formed on the second light-emitting unit 61, and the third light-emitting unit 71 is formed on the second intermediate connector layer 65. Then, the cathode 76 is formed on the third light-emitting unit 71.

The above-described organic EL element 50 has a so-called bottom emission-type configuration in which the anode 75 is a transparent electrode, the cathode 76 acts as a reflective electrode, and then light is extracted from the substrate 77. Furthermore, the element has the configuration in which a plurality of light-emitting units is laminated via the intermediate connector layers.

The first light-emitting unit 51 has the configuration in which a first positive hole transport layer 52, a first light-emitting layer 53, and a first electro transport layer 54 are laminated and formed from the anode 75 in this order.

The second light-emitting unit 61 has the configuration in which a second positive hole transport layer 62, a second light-emitting layer 63, and a second electro transport layer 64 are laminated and formed from the anode 75 (the first intermediate connector layer 55 side) in this order.

The third light-emitting unit 71 has the configuration in which a third positive hole transport layer 72, a third light-emitting layer 73, and a third electro transport layer 74 are laminated and formed from the anode 75 (the second intermediate connector layer 65 side) in this order.

The first positive hole transport layer 52, the second positive hole transport layer 62 and the third positive hole transport layer 72 have a function of transporting a positive hole, and include, in a broad sense, a positive hole injection layer and an electron blocking layer, and the like. In addition, the first electron transport layer 54, the second electron transport layer 64 and the third electron transport layer 74 have a function of transporting an electron, and include, in a broad sense, an electron injection layer and a positive hole blocking layer.

The organic EL element 50 is a white light-emitting element which contains at least a light-emitting organic material, for example, has light-emitting dopants of blue (B), green (G) and red (R) colors in the first light-emitting layer 53, the second light-emitting layer 63 and the third light-emitting layer 73.

In order to enhance the light-emitting efficiency of the organic EL element 50, it is preferable to provide a light-emitting layer which emits light having a short wavelength at the light extraction side.

Accordingly, in the organic EL element 50, a light-emitting dopant which emits blue light having a short wavelength is preferably contained in the first light-emitting layer 53. In addition, light-emitting dopants of green (G) and red (R) is preferably contained in the second light-emitting layer 63 and the third light-emitting layer 73.

Furthermore, as long as the organic EL element 50 has a configuration in which a desired color can be emitted, the kinds of the light-emitting dopant contained in the first light-emitting layer 53, the second light-emitting layer 63, and the third light-emitting layer 73 are not particularly limited. There can be applied to, for example, the first light-emitting layer 53/the second light-emitting layer 63/the third light-emitting layer 73, a configuration in which the light-emitting dopants such as blue/greenish red/greenish red, blue/blue/greenish red, greenish red/blue/greenish red, blue/green/greenish red, and blue/green/red, and the like are contained.

Accordingly, it is possible to set the light-emitting color of the first light-emitting layer 53, the second light-emitting layer 63, and the third light-emitting layer 73 to be an optional color.

Note that, in the following explanation, as one example of the organic EL element, there will be explained the case where the first light-emitting layer 53 is a blue light-emitting layer containing a blue light-emitting dopant, and the second light-emitting layer 63 and the third light-emitting layer 73 are a green and red (yellow) light-emitting layer containing a green light-emitting dopant and a red light-emitting dopant.

In the organic EL element 50, the first light-emitting layer 53 is a layer which emits blue having a short wavelength. The layer which is contact with the first light-emitting layer 53 on the anode 75 side is the first positive hole transport layer 52.

Accordingly, the first positive hole transport layer 52 is a layer having a shallower LUMO (Lowest Unoccupied Molecular Orbital) and a higher minimum triplet excitation energy (T1) than those of the first light-emitting layer 43.

In addition, in the organic EL element 50, the second light-emitting layer 63 is a layer which emits green and red having long wavelengths. Furthermore, the layer which is contact with the second light-emitting layer 63 on the anode 75 side is the second positive hole transport layer 62.

Accordingly, the second positive hole transport layer 62 is a layer which satisfies at least one of the relations of a deeper LUMO (Lowest Unoccupied Molecular Orbital) and a lower minimum triplet excitation energy (T1) than those of the second light-emitting layer 63.

Moreover, in the organic EL element 50, the third light-emitting layer 73 is a layer which emits green and red having long wavelengths. In addition, the layer which is contact with the third light-emitting layer 73 on the anode 75 side is the third positive hole transport layer 72.

Accordingly, the third positive hole transport layer 72 is a layer which satisfies at least one of the relations of a deeper LUMO (Lowest Unoccupied Molecular Orbital) and a lower minimum triplet excitation energy (T1) than those of the third light-emitting layer 73.

As described above, it is possible to suppress the deterioration of the light-emitting layer by providing a layer having a shallower LUMO and a higher T1 than those of the light-emitting layer on the anode side of the light-emitting layer with generally large reduction in brightness and emitting light having a short wavelength.

In addition, it is possible to promote the deterioration of the light-emitting layer by providing a layer which satisfies at least one of a deeper LUMO and a lower T1 than those of the light-emitting layer on the anode side of the light-emitting layer with generally small reduction in brightness and emitting light having a long wavelength.

The balance of the reduction in brightness of each light-emitting layer can be regulated by employing this configuration, and thus the lowering of the quality of white light emission of the organic EL element can be suppressed.

As described above, in the case where a plurality of light-emitting layers are provided in the organic EL element and a light-emitting layer having an optional light-emitting color in each light-emitting unit, the organic EL element having the same effects as those in the above-described first embodiment can be obtained by employing the layer configuration which satisfies the above-described conditions.

Namely, it is possible to suppress the reduction in brightness of the light-emitting layer by providing a layer having a shallow LUMO and a high T1 on the anode side of the light-emitting layer with generally large reduction in brightness and emitting light having a short wavelength. In addition, it is possible to promote the reduction in brightness of the light-emitting layer by providing a layer which satisfies at least one of a deep LUMO and a low T1 on the anode side of the light-emitting layer with generally small reduction in brightness and emitting light having a long wavelength.

With this layer configuration which satisfies the condition, the same effects as the above-described first embodiment can be obtained.

<5. Embodiment of Electronic Device (Fifth Embodiment)>
[Lighting Device-1]

Next, a lighting device will be explained as one embodiment of an electronic device where the organic EL element of the above first embodiment to the fourth embodiment is used.

The organic EL element used for a lighting device may be designed to impart a resonator structure to the organic EL element each having the configuration of the above first to fourth embodiments. The purpose of using of the organic EL element to be constituted as the resonator is a light source of an optical storage medium, a light source of an electrophotographic copying machine, a light source of an optical communication processor, a light source of a photosensor, and the like, and is not limited thereto. Furthermore, the element may be used for the above uses by laser oscillation.

Note that the materials used for the organic EL element can substantially be applied to the organic EL element which generates a white light emission (also referred to as white color organic EL element). For example, a white light emission can also be obtained by simultaneously emitting a plurality of light-emitting colors through the use of a plurality of light-emitting materials and by mixing colors. The combination of the plurality of light-emitting colors may include three maximum emission wavelengths of three primary colors, i.e. red, green and blue, or may include two maximum emission wavelengths by utilizing a complementary relations such as blue and yellow, bluish green and orange, and the like.

The combination of the light-emitting materials to obtain a plurality of emission colors maybe a combination of materials that emit a plurality of phosphorescent lights or fluorescent lights, or a combination of a light-emitting material that emits phosphorescent light or fluorescent light, and a dye material that emits light from a light-emitting material as an excited light. In the white color organic EL element, two or more light-emitting dopants may be combined and mixed.

The organic EL element itself emits white color light, unlike the configuration in which a white color light emission is obtained by arranging the organic EL elements of each color light emission in parallel independently in the form of array. Therefore, a mask is not required for the formation of most of layers constituting the element, and the whole surface of, for example, the electrically conductive layer can be formed by the vapor deposition method, the casting method, the spin coating method, the inkjet method, the printing method, and the like, which enhances productivity.

Furthermore, the light-emitting material used for the light-emitting layer of the white color organic EL element is not particularly limited, and, for example, a backlight in a liquid crystal display element may be whitened by combining optional materials selected from the metal complexes described in the above-described embodiments of the organic EL element and the known light-emitting materials so as to adapt to the wavelength range corresponding to a CF (color filter) characteristics.

It is possible to produce a lighting device which emits substantially white color light through the use of the white color organic EL element explained above.

[Lighting Device-2]

Furthermore, in the lighting device, it is also possible to enlarge its area of the light-emitting surface through use of a plurality of the organic EL elements. In this case, the light-emitting surface is enlarged by arranging, on a supporting substrate (namely tiling), a plurality of the light-emitting panels where the organic EL elements are provided on a base plate. The supporting substrate may also have a role of a sealing member, and each light-emitting panel is tiled between the supporting substrate and the base plate of the light-emitting panel in a state of sandwiching the organic EL element. The organic EL element may be sealed by filling an adhesive between the supporting substrate and the base plate. Note that terminals of the anode and the cathode are exposed around the light-emitting panel.

In the lighting device having such a configuration, the center of each light-emitting panel is the light-emitting region, and the non-light-emitting region is generated between the light-emitting panels. In order to increase an extraction amount of light from the non-light-emitting region, a light extraction member may be provided in the non-light-emitting region of the light extraction surface. A light-condensing sheet or a light-diffusion sheet can be used as the light extraction member.

EXAMPLE

Hereinafter, the present invention will be specifically explained by referring examples, and the present invention is not limited thereto.

<Manufacturing Organic EL Element>

Each organic EL element of Samples 101 to 112 was manufactured so that an area of the light-emitting region was 5 cm×5 cm. Hereinafter, the configurations and manufacturing procedures of each light-emitting thin film laminated body of Samples 101 to 112 will be shown.

In addition, the configurations of the organic EL elements of Samples 101 to 105 are shown in Table 1. Furthermore, the configurations of the organic EL elements of Samples 106 to 112 are shown in Table 2.

Samples 101 to 102, and 105 are the organic EL elements having the configuration shown in the above FIG. 1, Samples 103 to 104 are the organic EL elements having the configuration shown in the above FIG. 5, and Samples 106 to 112 are the organic EL elements having the configuration shown in the above FIG. 6.

[Producing the Organic EL Element of Sample 101]

(Anode)

A glass plate having a thickness of 0.7 mm was prepared as the transparent supporting substrate. In addition, an anode constituted of an ITO transparent electrode is formed by film-forming and patterning ITO (indium oxide) in a thickness of 110 nm on the transparent supporting substrate. After that, the transparent supporting substrate with the ITO transparent electrode was subjected to ultrasonic cleaning, to drying with a dry nitrogen gas, and to UV ozone cleaning for 5 minutes.

(First Positive Hole Transport Layer)

Next, the transparent supporting substrate obtained by forming the anode was fixed on a substrate holder of a commercially available vacuum vapor deposition apparatus. Then, each crucible for vapor deposition in the vacuum vapor deposition apparatus was filled with a material of each layer constituting the organic EL element of Sample 101, in an amount being suitable for producing the element. A crucible for vapor deposition produced by a material for resistance heating made of molybdenum or tungsten was used as the crucible for vapor deposition.

Subsequently, after depressurization to a vacuum level of $1 \times 10^{-4}$ Pa, an electric current was applied to a crucible for vapor deposition containing the compound 1-A (HAT-CN) shown in the following chemical structure to be heated, and the resultant substance was deposited on the anode at a vapor deposition rate of 0.1 nm/sec to thereby form a layer having a thickness of 20 nm.

[Chem. 2]

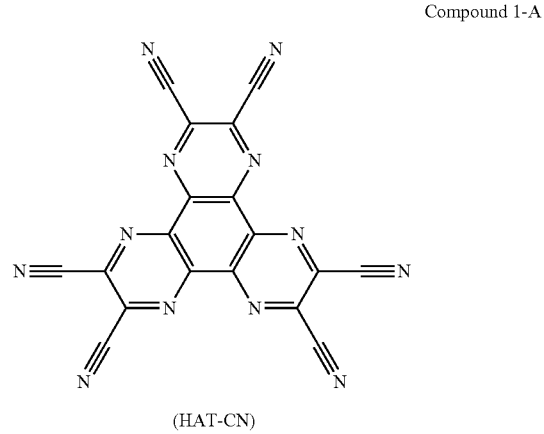

Compound 1-A (HAT-CN)

Then, the compound 1-B (glass transition point (Tg)=140° C.) shown in the following chemical structure was formed so as to have a thickness of 50 nm.

[Chem. 3]

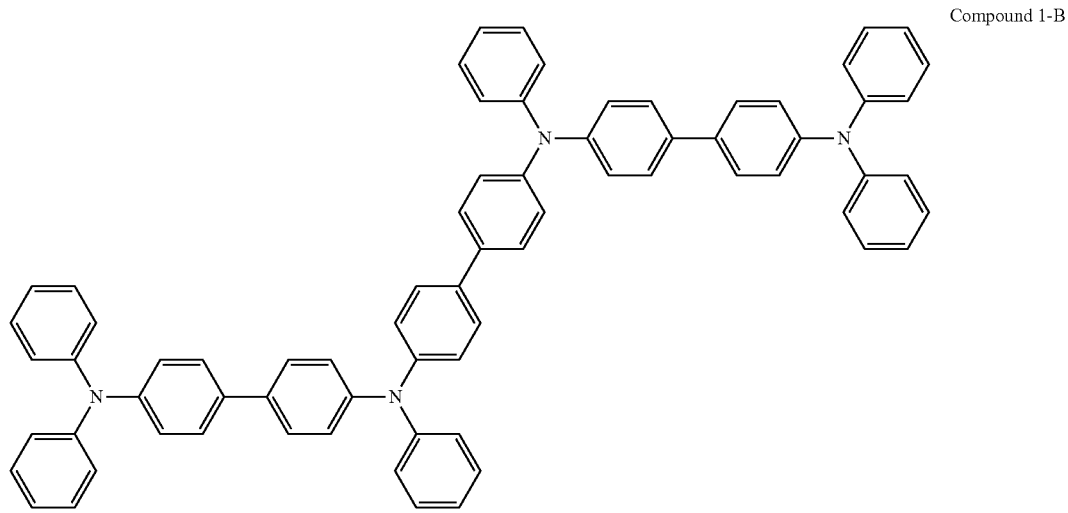

Compound 1-B

After that, the compound 1-C shown in the following chemical structure was formed so as to have a thickness of 10 nm.

[Chem. 4]

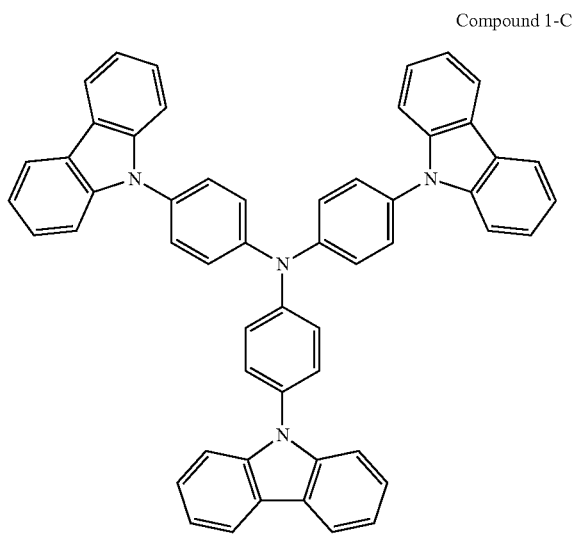

Compound 1-C

According to the above-described processes, the first positive hole transport layer obtained by laminating the compound 1-A, the compound 1-B, and the compound 1-C from the anode side was formed. The compound 1-C is a material having a shallower LUMO (Lowest Unoccupied Molecular Orbital) and having a higher minimum triplet excitation energy (T1) than those of the compound 2-A and the compound 2-B constituting the first light-emitting layer described later.

Namely, in LUMO, relations of 1-C>host compound and 1-C>light-emitting dopant hold. Furthermore, in T1, relations of 1-C>host compound, and 1-C>light-emitting dopant hold.

There was obtained a configuration in which an electron and triplet energy blocking layer was formed in the first positive hole transport layer, by using the above compound 1-C satisfying such relations for the layer being in contact with the first light-emitting layer.

(First Light-emitting Layer)

Next, a vapor deposition was carried out so as to be the compound 2-A (Tg=189° C.) shown in the following chemical structure as a host compound in an amount of 95% by volume and the compound 2-B shown in the following chemical structure as a blue fluorescent light-emitting dopant in an amount of 5% by volume. Thereby, a fluorescent light-emitting layer having a thickness of 30 nm and exhibiting a blue color, as the first light-emitting layer, was formed.

[Chem. 5]

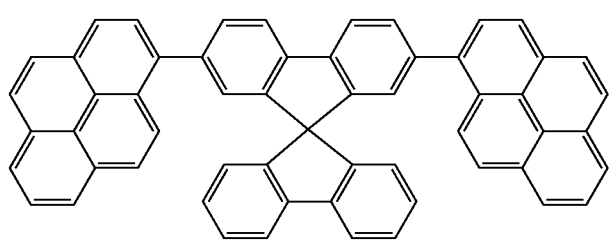

2-A

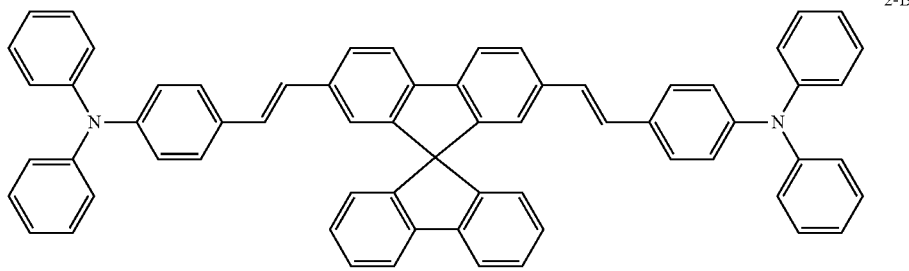
2-B (First Electron Transport Layer)

Subsequently, a vapor deposition was carried out so as to be the compound 3 (ET-100) shown in the following chemical structure in an amount of 86% by volume and LiF in an amount of 14% by volume, to thereby form a layer having a thickness of 20 nm. Furthermore, a vapor deposition was carried out so as to be the compound 3 (ET-100) in an amount of 98% by volume and Li in an amount of 2% by volume, to thereby form a layer having a thickness of 10 nm. Therefore, a first electron transport layer constituted of two layers of the compound 3 and LiF, and the compound 3 and Li was produced.

According to the above-described processes, the first light-emitting unit constituted of the first positive hole transport layer (including an electron and triplet energy blocking layer), the first light-emitting layer, and the first electron transport layer was produced.

Namely, in LUMO, relations of 1-B<host compound and 1-B<light-emitting dopant hold. Furthermore, in T1, relations of 1-B<host compound, and 1-B<light-emitting dopant hold.

(Second Light-emitting Layer)

Next, a vapor deposition was carried out so as to be the compound 4 (Tg=143° C.) shown in the following chemical structure as a host compound in an amount of 79% by volume, the compound 5 shown in the following chemical structure as a green phosphorescent light-emitting dopant in an amount of 20% by volume, and the compound 6 shown in the following chemical structure as a red phosphorescent light-emitting dopant in an amount of 1% by volume to form a phosphorescent light-emitting layer having a thickness of 20 nm and emitting green and red colors.

[Chem. 6]

ET-100

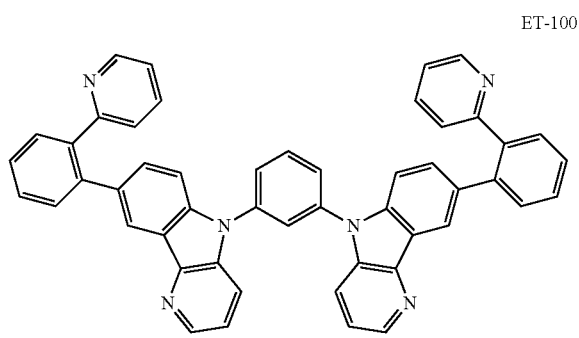

[Chem. 7]

Compound 4

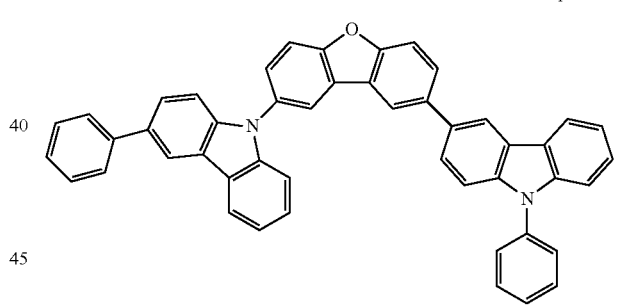

(Phosphorescent host compound)

(Intermediate Connector Layer)

Then, film formation of Ag was carried out so as to have a film thickness of 10 nm on the thus obtained first electron transport layer to thereby form an intermediate connector layer.

(Second Positive Hole Transport Layer)

After that, in the same way as in the above first positive hole transport layer, a layer of the compound 1-A (HAT-CN) having a film thickness of 20 nm, and a layer of the compound 1-B having a film thickness of 60 nm were formed.

According to the above-described processes, the second positive hole transport layer obtained by laminating the compound 1-A, and the compound 1-B from the anode side was formed. The compound 1-B is a material having a deeper LUMO (Lowest Unoccupied Molecular Orbital) and a lower minimum triplet excitation energy (T1) than those of the compound 4, the compound 5, and the compound 6 constituting the second light-emitting layer described later.

Compound 5

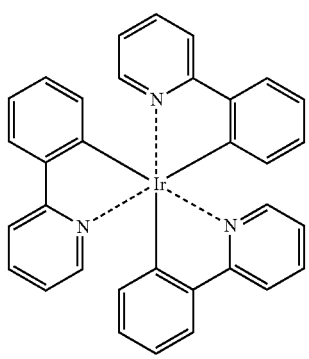

(Phosphorescent dopant)

-continued

Compound 6

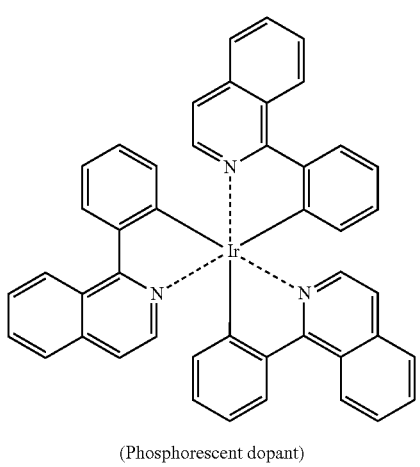

(Phosphorescent dopant)

(Second Electron Transport Layer)

Next, a vapor deposition was carried out so as to be the compound 3 (ET-100) in an amount of 86% by volume and LiF in an amount of 14% by volume to form a layer having a thickness of 20 nm. Further, a vapor deposition was carried out so as to be the compound 3 (ET-100) in an amount of 98% by volume and Li in an amount of 2% by volume to forma layer having a thickness of 10 nm. Thereby, a second electron transport layer constituted of two layers of the compound 3 and LiF, and the compound 3 and Li was obtained.

(Cathode and Sealing)

Next, a cathode was formed by vapor-depositing aluminum having 150 nm.

Next, the non-light-emitting surface of the above organic EL element was covered with a glass case, and a sealing material of an epoxy-based photocurable adhesive (LAC-STRACK LC0629B manufactured by TOAGOSEI) was provided at the peripheral part of the glass case which covers the organic EL element and which is in contact with the glass substrate (supporting substrate) on which the organic EL element was produced. Then, the sealing material was caused to tightly adhere to the glass substrate by overlapping with the glass substrate on the cathode side of the above organic EL element. After that, curing of the sealing material by irradiation with UV light from the glass case side seals the organic EL element, and the organic EL element of Sample 101 was produced.

Note that the sealing procedure of the glass case was carried out in the glove box under a nitrogen atmosphere (under an atmosphere of a high-purity nitrogen gas having a purity of 99.999% or more) without bringing the organic EL element into contact with an atmosphere.

[Producing the Organic EL Element of Sample 102]

The organic EL element of Sample 102 was produced using the same way as in the above Sample 101 except that, in the process constituting the second positive hole transport layer of the second light-emitting unit, the compound 1-C was formed so as to have a thickness of 10 nm after forming the compound 1-A so as to have a thickness of 20 nm and the compound 1-B so as to have a thickness of 50 nm.

The compound 1-C is a material having a shallower LUMO (Lowest Unoccupied Molecular Orbital) and a higher minimum triplet excitation energy (T1) than those of the compound 4, the compound 5, and the compound 6 constituting the second light-emitting layer.

Namely, in LUMO, relations of 1-C>host compound and 1-C>light-emitting dopant hold. Furthermore, in T1, relations of 1-C>host compound, and 1-C>light-emitting dopant hold.

[Producing the Organic EL Element of Sample 103]

The anode was produced using the same way as in the above Sample 101.

Next, the positive hole transport layer (first organic layer) was formed using the same way as in the above Sample 101, by laminating the compound 1-A having a thickness of 20 nm, the compound 1-B having a thickness of 60 nm, and the compound 1-C having a thickness of 60 nm from the anode side.

Next, a vapor deposition was carried out so as to be the compound 2-A (Tg=189° C.) as a host compound in an amount of 95% by volume and the compound 2-B as a blue fluorescent light-emitting dopant in an amount of 5% by volume. Thereby, a fluorescent light-emitting layer (first light-emitting layer) having a thickness of 30 nm and exhibiting a blue color was formed as the first light-emitting layer.

Subsequently, the compound 2-A was formed to have a thickness of 2 nm as the intermediate connector layer (second organic layer).

Then, a vapor deposition was carried out so as to be the compound 4 (Tg=143° C.) as a host compound in an amount of 79% by volume, the compound 5 as a green phosphorescent light-emitting dopant in an amount of 20% by volume, and the compound 6 as a red phosphorescent light-emitting dopant in an amount of 1% by volume to thereby form a phosphorescent light-emitting layer (second light-emitting layer) having a thickness of 20 nm and exhibiting green and red colors.

After that, a vapor deposition was carried out so as to be the compound 3 (ET-100) in an amount of 86% by volume and LiF in an amount of 14% by volume to thereby form a layer having a thickness of 100 nm.

Next, a cathode was formed by vapor depositing aluminum having 150 nm. Then, the organic EL element was sealed using the same way as in the above Sample 101 and the organic EL element of Sample 103 was produced.

Note that the compound 2-A constituting the intermediate connector layer (second organic layer) is a material having a deeper LUMO (Lowest Unoccupied Molecular Orbital) and a lower minimum triplet excitation energy (T1) than those of the compound 4, the compound 5, and the compound 6 constituting the second light-emitting layer.

Namely, in LUMO, relations of 2-A<host compound and 2-A<light-emitting dopant hold. Furthermore, in T1, relations of 2-A<host compound, and 2-A<light-emitting dopant hold.

[Producing the Organic EL Element of Sample 104]

The organic EL element of Sample 104 was produced using the same way as in the above Sample 103 except that the compound 1-C was formed to have a thickness of 2 nm as the intermediate connector layer (second organic layer).

The compound 1-C is a material having a shallower LUMO (Lowest Unoccupied Molecular Orbital) and a higher minimum triplet excitation energy (T1) than those of the compound 4, the compound 5, and the compound 6 constituting the second light-emitting layer.

Namely, in LUMO, relations of 1-C>host compound and 1-C>light-emitting dopant hold. Furthermore, in T1, relations of 1-C>host compound, and 1-C>light-emitting dopant hold.

[Producing the Organic EL Element of Sample 105]

The organic EL element of Sample 105 was produced using the same way as in the above Sample 101 except that, in the process constituting the second light-emitting layer of the second light-emitting unit, the thickness of the second light-emitting layer was 30 nm.

The following Table 1 shows the configurations of the organic EL elements of Samples 101 to 105. In addition, in Table 1, the relation of LUMO and T1 of the positive hole transport layer and the light-emitting layer in each configuration.

Note that, in Table 1, there are omitted the descriptions of the configurations of the substrate (glass), the anode (ITO), the electron transport layer (compound 3, LiF/compound 3, Li), and the intermediate connector layer (Ag) of each of Samples 101 to 102, 105, which are the common configurations in Samples 101 to 105.

Namely, in LUMO, relations of 1-B<host compound and 1-B<light-emitting dopant hold. Furthermore, in T1, relations of 1-B<host compound, and 1-B<light-emitting dopant hold.

(Third Light-emitting Layer)

Then, a vapor deposition was carried out so as to be the compound 4 (Tg=143° C.) as a host compound in an amount of 79% by volume, the compound 5 as a green phosphorescent light-emitting dopant in an amount of 20% by volume, and the compound 6 as a red phosphorescent light-emitting dopant in an amount of 1% by volume to thereby form a phosphorescent light-emitting layer (second light-emitting layer) having a thickness of 20 nm and emitting green and red colors.

TABLE 1

| | | First light-emitting unit | | Second light-emitting unit | | |
|---|---|---|---|---|---|---|
| Sample | Item | Positive hole transport layer | Light-emitting layer (Thickness) | Positive hole transport layer (Second organic layer) | Light-emitting layer (Thickness) | |
| 101 | Configuration | 1-A/1-B/1-C | Blue (30 nm) | 1-A/1-B | Greenish red (20 nm) | Present invention |
| | T1 | 1-C > Host compound | | 1-B < Host compound | | |
| | | 1-C > Light-emitting dopant | | 1-B < Light-emitting dopant | | |
| | LUMO | 1-C > Host compound | | 1-B < Host compound | | |
| | | 1-C > Light-emitting dopant | | 1-B < Light-emitting dopant | | |
| 102 | Configuration | 1-A/1-B/1-C | Blue (30 nm) | 1-A/1-B/1-C | Greenish red (20 nm) | Comparative |
| | T1 | 1-C > Host compound | | 1-C > Host compound | | |
| | | 1-C > Light-emitting dopant | | 1-C > Light-emitting dopant | | |
| | LUMO | 1-C > Host compound | | 1-C > Host compound | | |
| | | 1-C > Light-emitting dopant | | 1-C > Light-emitting dopant | | |
| 103 | Configuration | 1-A/1-B/1-C | Blue (30 nm) | 2-A | Greenish red (20 nm) | Present invention |
| | T1 | 1-C > Host compound | | 2-A < Host compound | | |
| | | 1-C > Light-emitting dopant | | 2-A < Light-emitting dopant | | |
| | LUMO | 1-C > Host compound | | 2-A < Host compound | | |
| | | 1-C > Light-emitting dopant | | 2-A < Light-emitting dopant | | |
| 104 | Configuration | 1-A/1-B/1-C | Blue (30 nm) | 1-C | Greenish red (20 nm) | Comparative |
| | T1 | 1-C > Host compound | | 1-C > Host material | | |
| | | 1-C > Light-emitting dopant | | 1-C > Light-emitting dopant | | |
| | LUMO | 1-C > Host compound | | 1-C > Host material | | |
| | | 1-C > Light-emitting dopant | | 1-C > Light-emitting dopant | | |
| 105 | Configuration | 1-A/1-B/1-C | Blue (30 nm) | 1-A/1-B | Greenish red (20 nm) | Present invention |
| | T1 | 1-C > Host compound | | 1-B < Host compound | | |
| | | 1-C > Light-emitting dopant | | 1-B < Light-emitting dopant | | |
| | LUMO | 1-C > Host compound | | 1-B < Host compound | | |
| | | 1-C > Light-emitting dopant | | 1-B < Light-emitting dopant | | |

[Producing the Organic EL Element of Sample 106]

First, the anode, the first light-emitting unit, the intermediate connector layer (first intermediate connector layer), and the second light-emitting unit were formed using the same way as in the above Sample 101, on the glass substrate.

(Intermediate Connector Layer)

Next, an Ag layer was formed to have a thickness of 10 nm, on the second electron transport layer of the second light-emitting unit and thus the second intermediate connector layer was formed.

(Third Positive Hole Transport Layer)

Subsequently, in the same way as in the first positive hole transport layer of the above Sample 101, a compound 1-A (HAT-CN) was formed to have a thickness of 20 nm, and a compound 1-B was formed to have a thickness of 60 nm.

According to the above-described processes, the third positive hole transport layer obtained by laminating the compound 1-A, and the compound 1-B from the anode side was formed. The compound 1-B is a material having a deeper LUMO (Lowest Unoccupied Molecular Orbital) and a lower minimum triplet excitation energy (T1) than those of the compound 4, the compound 5, and the compound 6 constituting the third light-emitting layer described later.

(Third Electron Transport Layer)

After that, a vapor deposition was carried out so as to be the compound 3 (ET-100) in an amount of 86% by volume and LiF in an amount of 14% by volume to thereby form a layer having a thickness of 20 nm. Furthermore, a vapor deposition was carried out so as to be the compound 3 (ET-100) in an amount of 98% by volume and Li in an amount of 2% by volume to thereby form a layer having a thickness of 10 nm. Therefore, a third electron transport layer constituted of two layers of the compound 3 and LiF, and the compound 3 and Li was produced.

(Cathode and Sealing)

Next, after forming the cathode by using the same way as in the above Sample 101, sealing of the organic EL element produces the organic EL element of Sample 106.

[Producing the Organic EL Element of Sample 107]

The organic EL element of Sample 107 was produced using the same way as in the above Sample 106 except that, in the process constituting the second positive hole transport layer of the second light-emitting unit, the compound 1-C was formed so as to have a thickness of 10 nm after forming the compound 1-A so as to have a thickness of 20 nm and the compound 1-B so as to have a thickness of 50 nm.

The compound 1-C is a material having a shallower LUMO (Lowest Unoccupied Molecular Orbital) and a higher minimum triplet excitation energy (T1) than those of the compound 4, the compound 5, and the compound 6 constituting the second light-emitting layer.

Namely, in LUMO, relations of 1-C>host compound and 1-C>light-emitting dopant hold. Furthermore, in T1, relations of 1-C>host compound, and 1-C>light-emitting dopant hold.

[Producing the Organic EL Element of Sample 108]

The organic EL element of Sample 108 was produced using the same way as in the above Sample 106 except that, in the process constituting the third positive hole transport layer of the third light-emitting unit, the compound 1-C was formed so as to have a thickness of 10 nm after forming the compound 1-A so as to have a thickness of 20 nm and the compound 1-B so as to have a thickness of 50 nm.

The compound 1-C is a material having a shallower LUMO (Lowest Unoccupied Molecular Orbital) and a higher minimum triplet excitation energy (T1) than those of the compound 4, the compound 5, and the compound 6 constituting the third light-emitting layer.

Namely, in LUMO, relations of 1-C>host compound and 1-C>light-emitting dopant hold. Furthermore, in T1, relations of 1-C>host compound, and 1-C>light-emitting dopant hold.

[Producing the Organic EL Element of Sample 109]

The organic EL element of Sample 109 was produced using the same way as in the above Sample 106 except that, in the process constituting the second positive hole transport layer of the second light-emitting unit and in the process constituting the third positive hole transport layer of the third light-emitting unit, the compound 1-C was formed so as to have a thickness of 10 nm after forming the compound 1-A so as to have a thickness of 20 nm and the compound 1-B so as to have a thickness of 50 nm.

[Producing the Organic EL Element of Sample 110]

The organic EL element of Sample 110 was produced using the same way as in the above Sample 107 except that the first light-emitting layer of the first light-emitting unit was changed to a phosphorescent light-emitting layer having a thickness of 20 nm which exhibits a green color and a red color, and the second light-emitting layer of the second light-emitting unit was changed to a fluorescent light-emitting layer having a thickness of 30 nm which exhibits a blue color.

In the organic EL element of Sample 110, the first light-emitting layer and the second light-emitting layer were formed in the same ways as in the second light-emitting layer and the first light-emitting layer of Sample 101.

[Producing the Organic EL Element of Sample 111]

The organic EL element of Sample 111 was produced using the same way as in the above Sample 110 except that, in the process constituting the third positive hole transport layer of the third light-emitting unit, the compound 1-C was formed so as to have a thickness of 10 nm after forming the compound 1-A so as to have a thickness of 20 nm and the compound 1-B so as to have a thickness of 50 nm

[Producing the Organic EL Element of Sample 112]

The organic EL element of Sample 112 was produced using the same way as in the above Sample 110 except that, in the process constituting the first positive hole transport layer of the first light-emitting unit, the compound 1-A was formed to have a thickness of 20 nm and the compound 1-B was formed to have a thickness of 60 nm.

The following Table 2 shows the configurations of the organic EL elements of Samples 106 to 112. In addition, in Table 2, the relation of LUMO and T1 of the positive hole transport layer and the light-emitting layer in each configuration.

Note that, in Table 2, there are omitted the descriptions of the configurations of the substrate (glass), the anode (ITO), the first to third electron transport layers (compound 3, LiF/compound 3, Li), and the first and second intermediate connector layers (Ag), which are the common configurations in Samples 106 to 112.

TABLE 2

| Sample | Item | First light-emitting unit | | Second light-emitting unit | | Third light-emitting unit | | |
|---|---|---|---|---|---|---|---|---|
| | | Positive hole transport layer | Light-emitting layer (Thickness) | Positive hole transport layer | Light-emitting layer (Thickness) | Positive hole transport layer | Light-emitting layer (Thickness) | |
| 106 | Configuration | 1-A/1-B/1-C | Blue (30 nm) | 1-A/1-B | Greenish red (20 nm) | 1-A/1-B | Greenish red (20 nm) | Present invention |
| | T1 | | 1-C > Host compound | | 1-B < Host compound | | 1-B < Host compound | |
| | | | 1-C > Light-emitting dopant | | 1-B < Light-emitting dopant | | 1-B < Light-emitting dopant | |
| | LUMO | | 1-C > Host compound | | 1-B < Host compound | | 1-B < Host compound | |
| | | | 1-C > Light-emitting dopant | | 1-B < Light-emitting dopant | | 1-B < Light-emitting dopant | |
| 107 | Configuration | 1-A/1-B/1-C | Blue (30 nm) | 1-A/1-B/1-C | Greenish red (20 nm) | 1-A/1-B | Greenish red (20 nm) | Present invention |
| | T1 | | 1-C > Host compound | | 1-C > Host compound | | 1-B < Host compound | |
| | | | 1-C > Light-emitting dopant | | 1-C > Light-emitting dopant | | 1-B < Light-emitting dopant | |
| | LUMO | | 1-C > Host compound | | 1-C > Host compound | | 1-B < Host compound | |
| | | | 1-C > Light-emitting dopant | | 1-C > Light-emitting dopant | | 1-B < Light-emitting dopant | |
| 108 | Configuration | 1-A/1-B/1-C | Blue (30 nm) | 1-A/1-B | Greenish red (20 nm) | 1-A/1-B/1-C | Greenish red (20 nm) | Present invention |
| | T1 | | 1-C > Host compound | | 1-B < Host compound | | 1-C > Host compound | |
| | | | 1-C > Light-emitting dopant | | 1-B < Light-emitting dopant | | 1-C > Light-emitting dopant | |
| | LUMO | | 1-C > Host compound | | 1-B < Host compound | | 1-C > Host compound | |
| | | | 1-C > Light-emitting dopant | | 1-B < Light-emitting dopant | | 1-C > Light-emitting dopant | |
| 109 | Configuration | 1-A/1-B/1-C | Blue (30 nm) | 1-A/1-B/1-C | Greenish red (20 nm) | 1-A/1-B/1-C | Greenish red (20 nm) | Comparative |
| | T1 | | 1-C > Host compound | | 1-C > Host compound | | 1-C > Host compound | |
| | | | 1-C > Light-emitting dopant | | 1-C > Light-emitting dopant | | 1-C > Light-emitting dopant | |
| | LUMO | | 1-C > Host compound | | 1-C > Host compound | | 1-C > Host compound | |
| | | | 1-C > Light-emitting dopant | | 1-C > Light-emitting dopant | | 1-C > Light-emitting dopant | |
| 110 | Configuration | 1-A/1-B/1-C | Greenish red (20 nm) | 1-A/1-B/1-C | Blue (30 nm) | 1-A/1-B | Greenish red (20 nm) | Present invention |
| | T1 | | 1-C > Host compound | | 1-C > Host compound | | 1-B < Host compound | |
| | | | 1-C > Light-emitting dopant | | 1-C > Light-emitting dopant | | 1-B < Light-emitting dopant | |
| | LUMO | | 1-C > Host compound | | 1-C > Host compound | | 1-B < Host compound | |
| | | | 1-C > Light-emitting dopant | | 1-C > Light-emitting dopant | | 1-B < Light-emitting dopant | |

TABLE 2-continued

|  |  | First light-emitting unit | | Second light-emitting unit | | Third light-emitting unit | | |
|---|---|---|---|---|---|---|---|---|
| Sample | Item | Positive hole transport layer | Light-emitting layer (Thickness) | Positive hole transport layer | Light-emitting layer (Thickness) | Positive hole transport layer | Light-emitting layer (Thickness) | |
| 111 | Configuration | 1-A/1-B/1-C | Greenish red (20 nm) | 1-A/1-B/1-C | Blue (30 nm) | 1-A/1-B/1-C | Greenish red (20 nm) | Comparative |
|  | T1 |  | 1-C > Host compound |  | 1-C > Host compound |  | 1-C > Host compound |  |
|  |  |  | 1-C > Light-emitting dopant |  | 1-C > Light-emitting dopant |  | 1-C > Light-emitting dopant |  |
|  | LUMO |  | 1-C > Host compound |  | 1-C > Host compound |  | 1-C > Host compound |  |
|  |  |  | 1-C > Light-emitting dopant |  | 1-C > Light-emitting dopant |  | 1-C > Light-emitting dopant |  |
| 112 | Configuration | 1-A/1-B | Greenish red (20 nm) | 1-A/1-B/1-C | Blue (30 nm) | 1-A/1-B | Greenish red (20 nm) | Present invention |
|  | T1 |  | 1-B < Host compound |  | 1-C > Host compound |  | 1-B < Host compound |  |
|  |  |  | 1-B < Light-emitting dopant |  | 1-C > Light-emitting dopant |  | 1-B < Light-emitting dopant |  |
|  | LUMO |  | 1-B < Host compound |  | 1-C > Host compound |  | 1-B < Host compound |  |
|  |  |  | 1-B < Light-emitting dopant |  | 1-C > Light-emitting dopant |  | 1-B < Light-emitting dopant |  |

[Evaluation]

The organic EL elements of Samples 101 to 112 obtained in the above-described manner were evaluated in their element properties according to the following manner. The results of each sample are shown in Table 3.

(Chromaticity Difference)

The measurement of chromaticity of each sample can be referred as, for example, Noboru OHTA, "SHIKISAI KOUGAKU 2nd edition" (Tokyo Denki University Press), and the like.

Specifically, a light emission spectrum of each sample when turning on under a constant current density of 50 mA/cm² at room temperature (in the range of about 23 to 25° C.) was measured by using a spectral emission luminance meter CS-2000 (manufactured by Konica Minolta Sensing). Then, the spectrum obtained by the measurement was converted to the chromaticity coordinate x, y from the reference color stimulus [X], [Y], [Z] defined by CIE 1931 color system by using the tristimulus values X, Y, Z.

In the same manner, an emission brightness of each sample when turning on under a constant current density of 50 mA/cm² was measured by using the spectral emission luminance meter CS-2000 (manufactured by Konica Minolta Sensing). Continuous driving was done under the same conditions, a period of time until the brightness was diminished to 30% was calculated as a light emission life.

Then, from the chromaticity coordinate x, y of the initial stage (LT100) and the chromaticity coordinate x, y of the time when the brightness was diminished to 30% (LT70), a chromaticity difference $\Delta E_{xy}$ was calculated from the following equation.

$$\Delta E_{xy} = [(x_{LT100} - x_{LT70})^2 + (y_{LT100} - y_{LT70})^2]^{1/2}$$

(Correlated Color Temperature)

The measurement of correlated color temperature of each sample can be referred as, for example, Noboru OHTA, "SHIKISAI KOUGAKU 2nd edition" (Tokyo Denki University Press), and the like.

Specifically, a light emission spectrum of each sample when turning on under a constant current density of 50 mA/cm² at room temperature (in the range of about 23 to 25° C.) was measured by using a spectral emission luminance meter CS-2000 (manufactured by Konica Minolta Sensing). Then, the spectrum obtained by the measurement was converted to the chromaticity coordinate u, v from the reference color stimulus [X], [Y], [Z] defined by CIE 1931 color system by using the tristimulus values X, Y, Z.

By referring the obtained chromaticity coordinate u, v to the blackbody locus and isotemperature line shown in the CIE1960uv chromaticity chart, a color temperature was determined.

The correlated color temperature of each organic EL element was represented by a value which was rounded off the hundred place of the obtained value.

TABLE 3

| Sample | Chromaticity difference $\Delta E_{xy}$ (LT100-LT70) | Color temperature (K) | |
|---|---|---|---|
| 101 | 0.003 | 5300 | Present invention |
| 102 | 0.028 | 5000 | Comparative |
| 103 | 0.015 | 5000 | Present invention |
| 104 | 0.025 | 4500 | Comparative |
| 105 | 0.010 | 4800 | Present invention |
| 106 | 0.005 | 4500 | Present invention |
| 107 | 0.006 | 4300 | Present invention |
| 108 | 0.006 | 4300 | Present invention |
| 109 | 0.025 | 4500 | Comparative |
| 110 | 0.006 | 4000 | Present invention |
| 111 | 0.023 | 3800 | Comparative |
| 112 | 0.004 | 3900 | Present invention |

Figure 7:
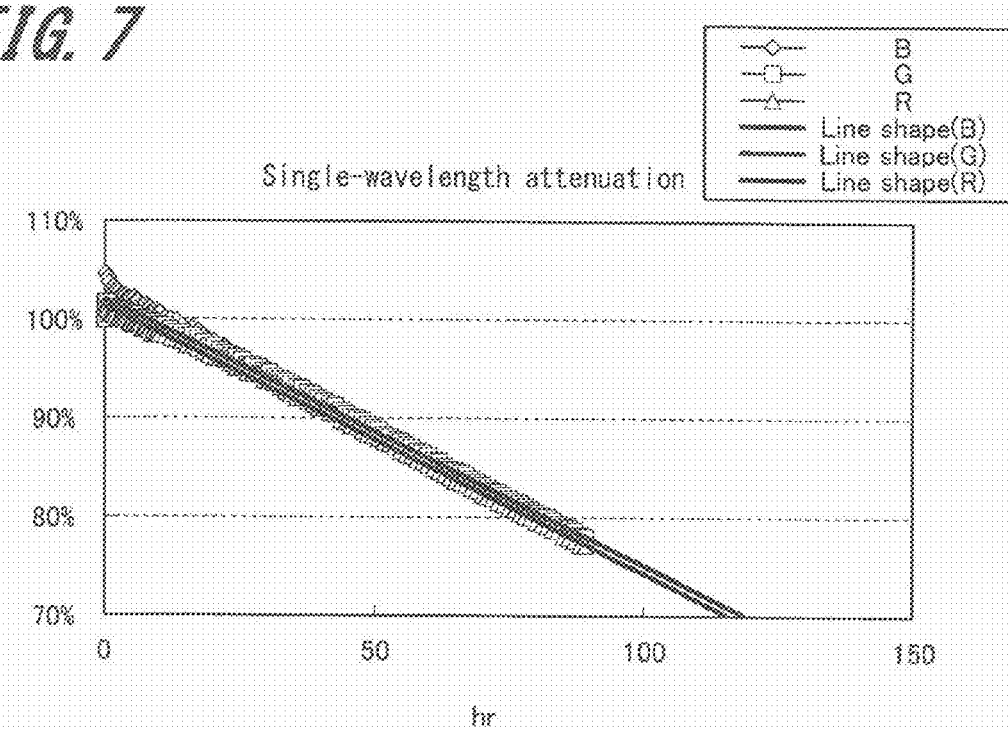
FIG. 7 is a graph showing a state of attenuation of single wavelength of each of red, blue and green in the sample 101 of the organic EL element in EXAMPLE.
Figure 8:
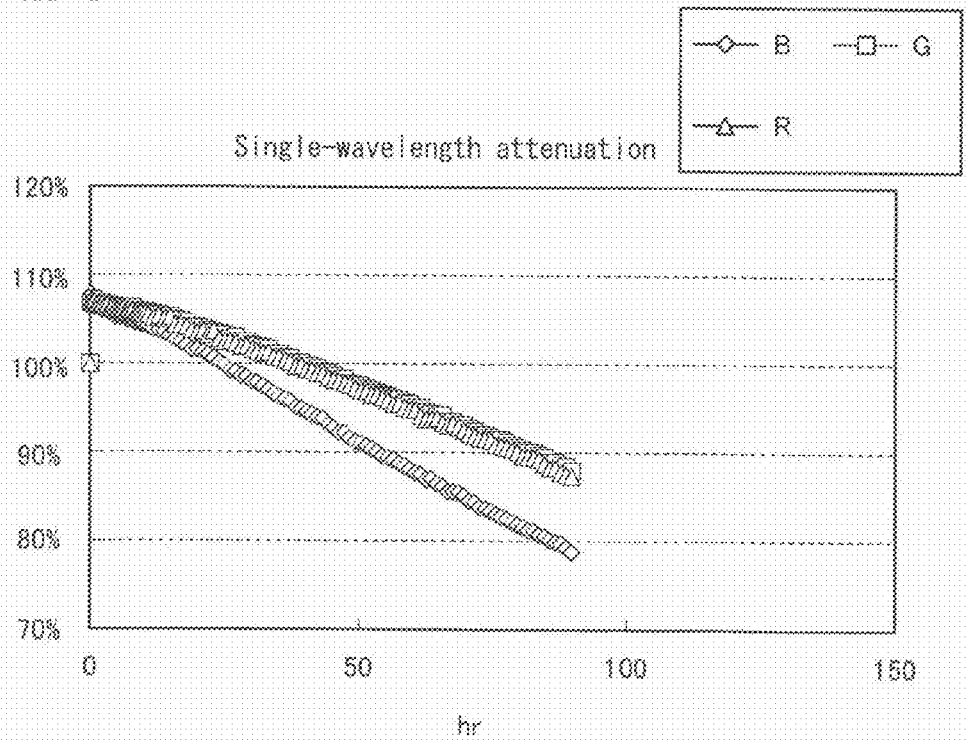
FIG. 8 is a graph showing a state of attenuation of single wavelength of each of red, blue and green in the sample 102 of the organic EL element in EXAMPLE.

In addition, FIGS. 7 to 10 show the diminish of the short wavelength of blue light, green light and red light, and the change of chromaticity of the organic EL element of Sample 101 and the organic EL element of Sample 102 during continuous driving at 50 mA/cm². In FIGS. 7 and 8, the axis of ordinate is a residual percentage of brightness, and the axis of abscissa is a period of continuous driving time.

FIG. 7 shows a manner of diminish of the each single wavelength of red, blue and green in the organic EL element of Sample 101. FIG. 8 shows a manner of diminish of the each single wavelength of red, blue and green in the organic EL element of Sample 102.

In FIGS. 7 and 8, "B" represents light of blue having a wavelength of 480 nm from the first light-emitting layer, "G" represents light of green having a wavelength of 545 nm from the second light-emitting layer, "R" represents light of red having a wavelength of 595 nm from the second light-emitting layer.

Figure 9:
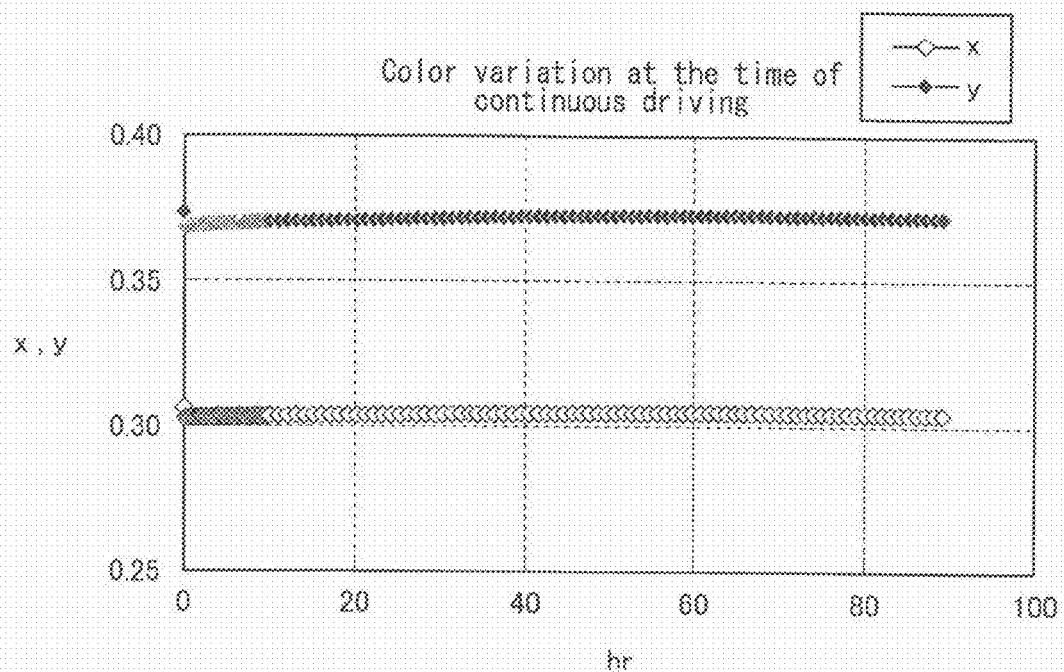
FIG. 9 is a graph showing a state of change of chromaticity coordinate x, y in the sample 101 of the organic EL element in EXAMPLE.
Figure 10:
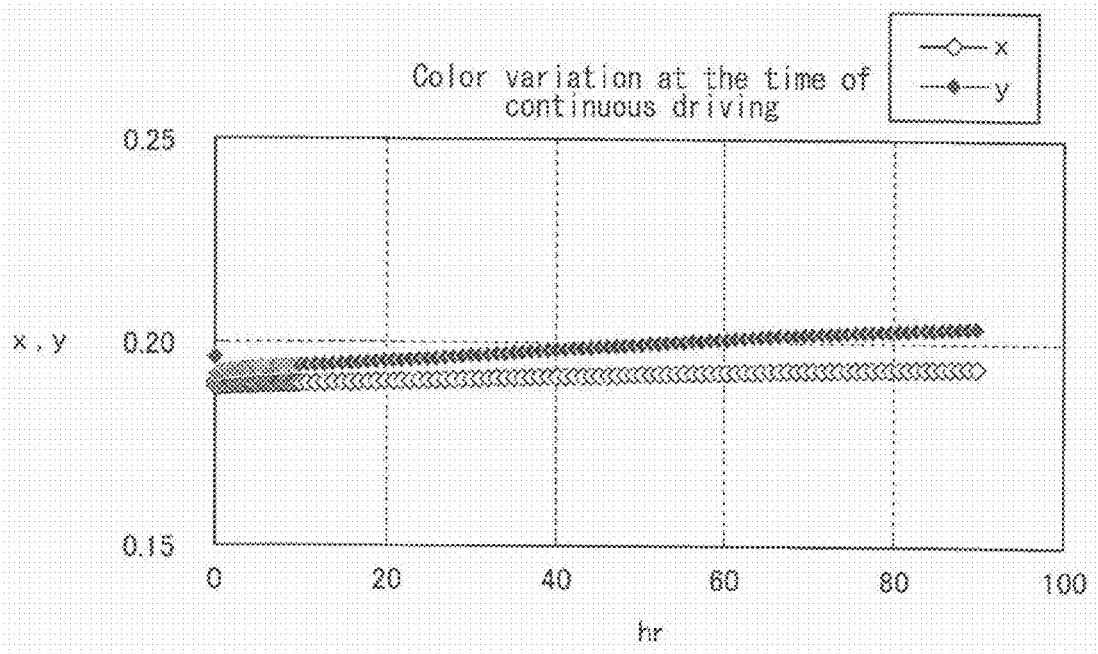
FIG. 10 is a graph showing a state of change of chromaticity coordinate x, y in the sample 102 of the organic EL element in EXAMPLE.

FIG. 9 shows a manner of change of the chromaticity coordinate x, y in the organic EL element of Sample 101. FIG. 10 shows a manner of change of the chromaticity coordinate x, y in the organic EL element of Sample 102. In FIGS. 9 and 10, the axis of ordinate is the chromaticity coordinate x, y, and the axis of abscissa is a period of continuous driving time.

[Results]

With respect to the organic EL element of Sample 101, in the first light-emitting unit, the first positive hole transport layer having a shallower LUMO (Lowest Unoccupied Molecular Orbital) and a higher minimum triplet excitation energy (T1) than those of the first light-emitting layer. Further in the second light-emitting unit, the second positive hole transport layer having a deeper LUMO (Lowest Unoccupied Molecular Orbital) and a lower minimum triplet excitation energy (T1) than those of the second light-emitting layer.

Therefore, it was possible to regulate the rates of reduction in brightness of the blue light-emitting layer and the green and red light-emitting layer, the chromaticity difference at the time of continuous driving of the organic EL element was the lowest value of 0.003 among the whole samples.

In contrast to this, as to the organic EL element of Sample 102, in the second light-emitting unit, the second positive hole transport layer having a shallower LUMO and a higher T1 than those of the second light-emitting layer was provided. Accordingly, it was not possible to regulate the rates of reduction in brightness of the blue light-emitting layer and the green and red light-emitting layer, the reduction in brightness of the blue light-emitting layer is larger than that of the green and red light-emitting layer, and thus the chromaticity difference at the time of the continuous driving of the organic EL element becomes worse up to 0.028.

In Sample 103 constituted of making the light-emitting unit sole layer, the intermediate connector layer which was contact with the second light-emitting layer on the anode side was formed by the compound 2-A having a deeper LUMO (Lowest Unoccupied Molecular Orbital) and a lower minimum triplet excitation energy (T1) than those of the second light-emitting layer. Therefore, it was possible to regulate the rates of reduction in brightness of the blue light-emitting layer and the green and red light-emitting layer, the chromaticity difference at the time of continuous driving of the organic EL element was 0.015, which was an excellent result.

In contrast to this, as to Sample 104 also constituted of making the light-emitting unit sole layer, the intermediate connector layer which was contact with the second light-emitting layer on the anode side was formed by the compound 1-C having a shallower LUMO (Lowest Unoccupied Molecular Orbital) and a higher minimum triplet excitation energy (T1) than those of the second light-emitting layer. As a result, it was not possible to regulate the rates of reduction in brightness of the blue light-emitting layer and the green and red light-emitting layer, the reduction in brightness of the blue light-emitting layer was larger than that of the green and red light-emitting layer, and thus the chromaticity difference at the time of the continuous driving of the organic EL element became worse up to 0.025.

As to Sample 105, the thickness of the second light-emitting layer was larger than Sample 101, and the first light-emitting layer and the second light-emitting layer had the same thickness. As to Sample 105, the chromaticity difference was 0.010 which was better result than Sample 102, but became worse than Sample 101.

This result show that, as is Sample 101, by the fact that the light-emitting layer with generally small reduction in brightness was formed thinner than the light-emitting layer having a large reduction in brightness, the deterioration of the compound can be further promoted. Therefore, the balance of the reduction in brightness of each light-emitting layer can be regulated, and the color change from the initial emitted color with the lapse of drive time can be suppressed.

Also in the results of the organic EL elements of Samples 106 to 109 in which three light-emitting units were laminated, there are observed the same tendency of the results as the organic EL element of Samples 101 to 105.

Sample 106 has the first positive hole transport layer having a shallower LUMO and a higher T1 than those of the first light-emitting layer in the first light-emitting unit.

Furthermore, the positive hole transport layers having a deeper LUMO and a lower T1 than those of each light-emitting layer are provided in the second light-emitting unit and the third light-emitting unit.

Namely, in the first to third light-emitting units, the same relationship of LUMO and T1 as in the above Sample 101 is satisfied. As a result, the chromaticity difference of Sample 106 at the time of continuous driving of the organic EL element was 0.005, which was an excellent result.

In contrast to this, as to the organic EL element of Sample 109, in the second light-emitting unit and the third light-emitting unit, the relationship of LUMO and T1 is not satisfied. As a result, the chromaticity difference at the time of the continuous driving of the organic EL element is greatly deteriorated in comparison with the organic EL element of Sample 106.

As to Sample 107 and Sample 108, in the second light-emitting unit or the third light-emitting unit, any of the units did not satisfy the relationship of LUMO and T1. As a result, the chromaticity difference is slightly deteriorated in comparison with Sample 106. However, in the second light-emitting unit or the third light-emitting unit, the chromaticity difference is greatly advanced in comparison with the organic EL element of Sample 109 since any of the units satisfies the relationship of LUMO and T1.

Accordingly, in general, in the organic EL element of the configuration having a plurality of the light-emitting layers with generally small reduction in brightness, the color change of the organic EL element from the initial emitted color with the lapse of drive time can be suppressed by forming the layer which satisfies the relationship of LUMO and T1 in contact with at least one of either light-emitting layers with generally small reduction in brightness.

Furthermore, when forming the layer which satisfies the relationship of LUMO and T1 in contact with every light-emitting layer with generally small reduction in brightness, the color change of the organic EL element from the initial emitted color with the lapse of drive time can be suppressed more.

In the results of the organic EL elements of Samples 110 to 112 where the order of lamination was changed, there are observed the same tendency of the results as the organic EL element of Samples 106 to 108.

In the chromaticity differences at the time of continuous driving, Sample 112 where the relationship of LUMO and T1 is satisfied in the first light-emitting unit and the third light-emitting unit, and Sample 110 where the relationship of LUMO and T1 is satisfied only in the third light-emitting unit gave good results than Sample 111 where the relationship of LUMO and T1 is not satisfied in the first light-emitting unit and the third light-emitting unit.

Further, in the chromaticity differences at the time of continuous driving, Sample 112 in which the relationship of LUMO and T1 is satisfied in the first light-emitting unit and the third light-emitting unit gave better results than Sample 110 in which the relationship of LUMO and T1 is satisfied only in the third light-emitting unit.

As described above, in any case where the light-emitting layers with generally small reduction in brightness and the light-emitting layers with generally large reduction in brightness are laminated in any order in the organic EL element, the color change of the organic EL element from the initial emitted color with the lapse of drive time can be suppressed when the above-described relationship is satisfied.

In addition, as shown FIG. 7, in the organic EL element of Sample 101 in which the first positive hole transport layer having a shallow LUMO and a high T1 is provided in contact with the first light-emitting layer, and the second positive hole transport layer having a deep LUMO and a low T1 is provided in contact with the second light-emitting layer, states of attenuation of the blue light, green light and red light almost coincide with each other.

In contrast to this, as shown in FIG. 8, in the organic EL element of Sample 102 where the first positive hole transport layer and the second positive hole transport layer both having a shallow LUMO and a high T1 are provided in contact with the first light-emitting layer and the second light-emitting layer, there is a large difference between a state of attenuation of blue light of the first light-emitting layer and a state of attenuation of green and red lights of the second light-emitting layer.

In addition, comparing FIG. 7 and FIG. 8, the manners of diminish of blue light of the first light-emitting layer are analogous, but in FIG. 7 there is a large difference as to a state of attenuation of green and red lights of the second light-emitting layer in comparison with FIG. 8. Specifically, states of attenuation of green and red lights of the second light-emitting layer shifts to a state of attenuation of blue light of the first light-emitting layer.

From the results shown in FIG. 7 and FIG. 8, by providing the second positive hole transport layer having a deep LUMO and a low T1 in contact with the second light-emitting layer, it has been found that the degradation is promoted in the light-emitting layers with generally small reduction in brightness.

Also, in FIG. 9 and FIG. 10, the same results are obtained.

As shown in FIG. 9, in the organic EL element of Sample 101, variation of the chromaticity coordinate x, y is small even a period of drive time has been advanced. This is because, as shown in the above FIG. 7, that states of attenuation of blue, green and red lights almost coincide with each other.

Further, as shown in FIG. 10, in the organic EL element of Sample 102, variation of the chromaticity coordinate x, y is large with the lapse of drive time. This is because, as shown in the above FIG. 8, that there is a large difference between a state of attenuation of blue light and a state of attenuation of green and red lights.

Accordingly, from the results shown in FIGS. 7 to 10, when providing the layer having a shallow LUMO and a high T1 in contact with the light-emitting layers with generally large reduction in brightness, and the layer which satisfies at least one of a deep LUMO and a low T1 in contact with the light-emitting layers with generally small reduction in brightness, the color change of the organic EL element from the initial emitted color with the lapse of drive time can be suppressed.

The present invention is not limited to the configurations in the above-described embodiments, and it is possible to make various deformations and changes within the scope of the invention.

BRIEF DESCRIPTION OF THE REFERENCE SYMBOLS 10, 30, 40, 50 organic EL element,
11, 51 first light-emitting unit,
12, 61 second light-emitting unit,
13, 52 first positive hole transport layer,
13A electron blocking layer,
14, 33, 43, 53 first light-emitting layer,
14A, 17A light-emitting region,
15, 54 first electron transport layer,
16, 62 second positive hole transport layer,
17, 34, 45,63 second light-emitting layer,
18, 64 second electron transport layer,
19 intermediate connector layer,
21, 36, 47, 75 anode,
22, 37, 48, 76 cathode,
23, 38, 49, 77 substrate,
31, 41 light-emitting unit,
32 positive hole transport layer,
35 electron transport layer,
42 first organic layer,
44 second organic layer,
46 third organic layer,
55 first intermediate layer,
65 second intermediate layer,
71 third light-emitting unit,
72 third positive hole transport layer,
73 third light-emitting layer,
74 third electron transport layer

What is claimed is:

1. An organic electroluminescent element comprising:
an anode,
a cathode,
a first light-emitting layer and a second light-emitting layer which are interposed between the anode and the cathode,
a layer which is in contact with the first light-emitting layer on the anode side and satisfies relations of having a shallower LUMO (Lowest Unoccupied Molecular Orbital) and of having a higher minimum triplet excitation energy (T1) than those of the first light-emitting layer, and
a layer which is in contact with the second light-emitting layer on the anode side
and satisfies at least any one of relations of having a deeper LUMO (Lowest Unoccupied Molecular Orbital) and of having a lower minimum triplet excitation energy (T1) than those of the second light-emitting layer.

2. The organic electroluminescent element according to claim 1, wherein
the layer which is in contact with the second light-emitting layer satisfies both relations of having a deeper LUMO (Lowest Unoccupied Molecular Orbital) and having a lower minimum triplet excitation energy (T1) than those of the second light-emitting layer.

3. The organic electroluminescent element according to claim 1, wherein
a wavelength of the light-emitting light from the first light-emitting layer is shorter than a wavelength of the light-emitting light from the second light-emitting layer.

4. The organic electroluminescent element according to claim 1, wherein
a thickness of the second light-emitting layer is formed smaller than that of the first light-emitting layer.

5. The organic electroluminescent element according to claim 1, wherein
the first light-emitting layer is formed closer to the light extraction side of the organic electroluminescent element than the second light-emitting layer.

6. The organic electroluminescent element according to claim 1, further comprising an intermediate connector layer between the first light-emitting layer and the second light-emitting layer.

7. The organic electroluminescent element according to claim 6, wherein
the intermediate connector layer is an electric charge-generating layer or a metal layer.

8. The organic electroluminescent element according to claim 1, further comprising:
a third light-emitting layer together with the first light-emitting layer and the second light-emitting layer, and
a layer which is in contact with the third light-emitting layer on the anode side and satisfies at least one of relations of having a deeper LUMO (Lowest Unoccupied Molecular Orbital) and of having a lower minimum triplet excitation energy (T1) than those of the third light-emitting layer.

9. An electronic device comprising the organic electroluminescent element according to claim 1.

* * * * *